(12) United States Patent
Bizen et al.

(10) Patent No.: US 9,336,984 B2
(45) Date of Patent: May 10, 2016

(54) CHARGED PARTICLE BEAM DEVICE AND MEASURING METHOD USING THE SAME

(71) Applicant: Hitachi High-Technologies Corporation, Minato-ku, Toyko (JP)

(72) Inventors: Daisuke Bizen, Tokyo (JP); Hajime Kawano, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/244,802

(22) Filed: Apr. 3, 2014

(65) Prior Publication Data

US 2014/0299767 A1 Oct. 9, 2014

(30) Foreign Application Priority Data

Apr. 3, 2013 (JP) .................................. 2013-077335

(51) Int. Cl.
*H01J 37/00* (2006.01)
*H01J 37/28* (2006.01)
*H01J 37/244* (2006.01)

(52) U.S. Cl.
CPC .............. *H01J 37/28* (2013.01); *H01J 37/244* (2013.01); *H01J 2237/2448* (2013.01); *H01J 2237/2449* (2013.01); *H01J 2237/24485* (2013.01); *H01J 2237/281* (2013.01); *H01J 2237/2806* (2013.01)

(58) Field of Classification Search
USPC .......................................................... 250/306
See application file for complete search history.

(56) References Cited

U.S. PATENT DOCUMENTS

| 6,593,152 | B2 * | 7/2003 | Nakasuji | ............... | G01N 23/225 |
| | | | | | 250/492.3 |
| 6,646,262 | B1 * | 11/2003 | Todokoro | .............. | H01J 37/244 |
| | | | | | 85/9 |
| 7,244,932 | B2 * | 7/2007 | Nakasuji | ............... | G01N 23/225 |
| | | | | | 250/306 |
| 8,450,699 | B2 * | 5/2013 | Ohshima | ............... | H01J 37/065 |
| | | | | | 250/309 |
| 2007/0187598 | A1 * | 8/2007 | Tachibana et al. | ............ | 250/310 |

FOREIGN PATENT DOCUMENTS

JP 2001-357808 A 12/2001
WO WO 01/75929 A1 10/2001

* cited by examiner

*Primary Examiner* — Phillip A Johnston
(74) *Attorney, Agent, or Firm* — Miles & Stockbridge P.C.

(57) ABSTRACT

In an SEM provided with an ExB deflector for deflecting secondary electrons outside an optical axis of a primary electron beam between an electronic source and an object lens for condensing the primary electron beam and irradiating a sample with the beam, a unit to decelerate the secondary electrons deflected in the ExB deflector, and a magnetic generator for deflecting the decelerated secondary electron are provided, and a plurality of energy filters and detectors are arranged around the magnetic generator. That is, by separating loci of the secondary electrons incident on the energy filters and of the secondary electrons reflected at the energy filters by the magnetic generator, both of the secondary electrons are concurrently detected.

9 Claims, 22 Drawing Sheets

SEM IMAGE A

SEM IMAGE B

CHARGED PARTICLE BEAM DEVICE AND MEASURING METHOD USING THE SAME

CROSS-REFERENCE TO RELATED APPLICATION

This application claims the priority of Japanese Patent Application No. 2013-077335 filed Apr. 3, 2013, which is incorporated herein by reference in its entirety.

BACKGROUND OF THE INVENTION

1. Field of the Invention

The present invention relates to a charged particle beam device, and a measuring method using the same.

2. Description of the Related Art

Currently, in the manufacturing line of semiconductors, technologies of measuring the dimension of a circuit pattern formed on a wafer in the middle of a process have a significant role for improvement of the yield. Conventionally, most of the measuring technologies have been based on optical microscopes. However, currently, measuring devices based on SEMs (hereinafter, SEM-based length measuring devices) have been widely spread due to micronization of semiconductor patterns.

Then, in recent years, diversification and three dimensional structures of materials used in the semiconductor devices have been advanced. Therefore, demands for dimension measurement among different types of materials and for dimension measurement of three dimensional devices are increasing.

As a means to obtain a contrast among different types of materials in an SEM, there is a method of performing energy discrimination of the secondary electrons detected in the SEM. Here, the "secondary electrons" include "true secondary electrons" (electrons of 50 eV or less, which are generated such that a primary electron beam is inelastically scattered inside a sample and excites atoms inside the sample, and electrons generated therefrom are released from the surface) and reflected electrons (having almost the same energy as the primary electrons, which are generated such that the primary electrons are backscattered inside the sample, and electrons get out of the surface). By making use of this, various measurements become possible by discriminating the secondary electrons sensitive for surface forms and the reflected electrons having information of embedded form under the surface. Hereinafter, secondary electrons include both of "true secondary electron" and the "reflected electron" unless otherwise specified.

Meanwhile, most of the three dimensional devices have shapes with high aspect deep grooves and deep holes. When measuring the dimension of the deep grooves and deep holes with the SEM-based length measuring device, efficient detection of secondary electrons having got out of the groove bottoms and hole bottoms is required. This is due to an effect of side walls. Many of the secondary electrons that can get out of the groove bottoms or hole bottoms are emitted in the vicinity of the optical axis of the primary electrons where the electrons are less subject to the effect of the side walls. Therefore, it is necessary to detect the secondary electrons emitted in the vicinity of the optical axis for observation and measurement of deep grooves and deep holes.

As an example of a configuration that enables the energy discrimination of the secondary electrons, there is a configuration disclosed in WO 01/075929 A. In WO 01/075929 A, a negative voltage is applied to a metal grid, and only the secondary electrons having passed through the metal grid are detected. In this case, to pass through the electrode grid, the secondary electrons need to have energy larger than the voltage applied to the grid, and thus the energy discrimination of the secondary electrons becomes possible.

Hereinafter, the metal grid to which the negative voltage used from the energy discrimination of the secondary electrons is applied is called "energy filter". Meanwhile, as a configuration that enables the energy discrimination of the secondary electrons emitted in the vicinity of the optical axis, there is a configuration disclosed in JP-2001-357808-A. In JP-2001-357808-A, only secondary electrons are deflected outside the optical axis by an ExB deflector that is an optical element in which a magnetic field and an electric field are mutually orthogonal, and an energy filter is disposed between the ExB deflector and a detector.

SUMMARY OF THE INVENTION

When observing a semiconductor device with an SEM, the energy of the primary electron beam is favorably set to low energy, for example, 1 keV or less, in order to reduce the damage to the sample. However, in a state where the energy of the primary electron beam is low, a locus of the electron beam is subject to an effect of other optical systems (parts), and thus, measurement accuracy is reduced.

From the above reason, to observe a sample with a high resolution even in a state where the energy of the primary electron beam is low, a retarding method of applying a negative voltage to the sample, and decelerating the primary electron beam immediately before the sample is effective.

However, when the regarding method is used in the SEM disclosed in WO 01/075929 A, the following problems occur.

Typically, in the retarding method, a negative voltage of several kV (hereinafter, retarding voltage) is applied to the sample. In this case, secondary electrons generated in the sample are accelerated and condensed by the retarding voltage, and are collected in the vicinity of an optical axis. Therefore, a part of the secondary electrons passes through the opening of the energy filter (reference sign 112 in FIG. 7 of WO 01/075929 A). In the vicinity of the opening of the energy filter (reference sign 112 in FIG. 7 of WO 01/075929 A), a potential barrier necessary for discrimination of the secondary electrons is not formed. Therefore, there is a possibility that the secondary electrons having lower energy than the voltage applied to the energy filter may pass through the opening. On the other hand, the secondary electrons that have passed through the hole of the reflection plate (reference sign 29 in the representative drawing of WO 01/075929 A) may not sometimes be detected.

Further, most of the secondary electrons passing through the opening of the energy filter (reference sign 112 in FIG. 7 of WO 01/075929 A) or the reflection plate (reference sign 29 in the representative drawing of WO 01/075929 A) are secondary electrons getting out of a groove bottom and a hole bottom. Therefore, the configuration of WO 01/075929 A may decrease the sensitivity in observation and measurement of deep grooves and deep holes.

Further, to discriminate the secondary electrons accelerated by the retarding voltage, it is necessary to apply the same voltage as the retarding voltage to the grid of the energy filter. As a result, the secondary electrons reflected at the energy filter are also accelerated to several kV. In this case, the secondary electrons reflected at the energy filter have higher energy. Thus, it is difficult for a detector below the energy filter to detect the secondary electrons (reference sign 40 in FIG. 10 of WO 01/075929 A). Therefore, it is difficult for the SEM disclosed in WO 01/075929 A to perform energy discrimination of both of the secondary electrons having passed through the energy filter and the secondary electron having been reflected at the energy filter at the same time.

Meanwhile, the SEM disclosed in JP-2001-357808-A allows the secondary electrons to pass through the energy filter after deflecting the secondary electrons outside the optical axis by the ExB deflector, and thus energy discrimination of the secondary electrons emitted in the vicinity of the optical axis is possible. In addition, a technique of disposing a deflection coil (reference sign 16a in FIG. 3 of JP-2001-357808-A) between the energy filter and the ExB deflector, separating loci of the secondary electrons incident on the energy filter and of the secondary electron reflected at the energy filter, and concurrently obtaining both of the secondary electrons is disclosed.

However, when the SEM disclosed in JP-2001-357808-A is used in a state where the retarding voltage is high (for example, several kV), it is difficult to detect both of the secondary electrons incident on the energy filter and the secondary electrons reflected at the energy filter without a loss. Hereafter, a reason thereof is described.

To detect both of the secondary electrons incident on the energy filter and the secondary electrons reflected at the energy filter without a loss, it is necessary that a detector for detecting the secondary electrons reflected at the energy filter does not interrupt the locus of the secondary electrons incident on the energy filter. Therefore, it is necessary to widely separate the locus of the electrons incident on the energy filter and the locus of the electrons reflected at the energy filter.

However, in the SEM actually disclosed in JP-2001-357808-A, the deflection angle of the secondary electrons by the deflection coil is about 2°. When the deflection angle is about 2°, it is difficult to directly guide the secondary electrons reflected at the energy filter to the detector without interrupting the locus of the secondary electrons incident on the energy filter, due to the limitation of space. Actually, in the SEM disclosed in JP-2001-357808-A, the secondary electrons reflected at the energy filter is detected by the reflection plate (reference sign 18b in FIG. 3 of JP-2001-357808-A). This is because there is no enough space above the object lens 9 to arrange a detector with an angle capable of directly detecting the electrons, in the locus where the deflection angle is about 2°. Further, by the inventors' examination, it has been found out that the method of detecting the electrons using the reflection plate further decreases the number of detected reflected electrons, which are originally small, and provides a cause to decrease the S/N.

Further, in JP-2001-357808-A, a magnetic field generated by a deflection coil is used to separate the loci of the secondary electrons. However, there is a problem that the current flowing in the deflection coil (calorific value) becomes larger in order to deflect the secondary electrons in a large way when the retarding voltage is large. That is, the deflection coil disclosed in JP-2001-357808-A is not suitable for deflection with a large angle.

To solve the above problem, a charged particle beam device according to the present application includes: a charged particle source configured to generate a charged particle beam; a first deflector configured to deflect the charged particle beam from the charged particle source; a condenser lens configured to condense the charged particle beam; a stage configured to hold a sample to be irradiated with the charged particle beam; a power source unit configured to apply a retarding voltage that decelerates the charged particle beam to the sample or the stage; a second deflector configured to deflect a second electron from the sample outside an optical axis of the charged particle beam; a first grid configured to allow an electron to pass through or to reflect the electron according to energy of the electron; a first detector configured to detect the second electron that has passed through the first grid; a second detector configured to detect the second electron that has been reflected at the first grid; and a magnetic generator configured to deflect each of the second electron that has been reflected at the first grid, and the second electron that has passed through the first grid.

Further, a measuring method according to the present application, is a length measuring method using the above-described charged particle beam device, the method including: forming a first image by a signal obtained in the first detector; forming a second image by a signal obtained in the second detector; and measuring a dimension of a pattern of the sample from each of the first image and the second image, wherein measuring points of the dimension of the sample are different in the first image and the second image.

With the above configuration, the secondary electron can be largely deflected. By use this phenomenon, both secondary electrons incident on and reflected at the energy filter can be directly detected.

DESCRIPTION OF THE PREFERRED EMBODIMENTS

The inventors of the present invention have examined an SEM, which includes an ExB deflector for deflecting secondary electrons outside an optical axis of a primary electron beam, between an electronic source and an object lens for condensing the primary electron beam and irradiating a sample with the beam. In the SEM, a means to decelerate the secondary electrons deflected in the ExB deflector, and a magnetic generator for deflecting the decelerated secondary electron are provided, and a plurality of energy filters and detectors are arranged around the magnetic generator.

Accordingly, the secondary electrons are incident on the magnetic generator after being deflected in the ExB deflector and decelerated, whereby the secondary electrons can be deflected in a large way while the magnetic field of the magnetic generator remains low, even if a large retarding voltage is applied. An energy filter and a detector are disposed together with the above-described mechanism, whereby both of the secondary electrons incident on and reflected at the energy filter can be directly detected without a loss.

Hereinafter, embodiments for implementing the present invention will be described in detail with reference to the drawings.

First Embodiment

Figure 1:
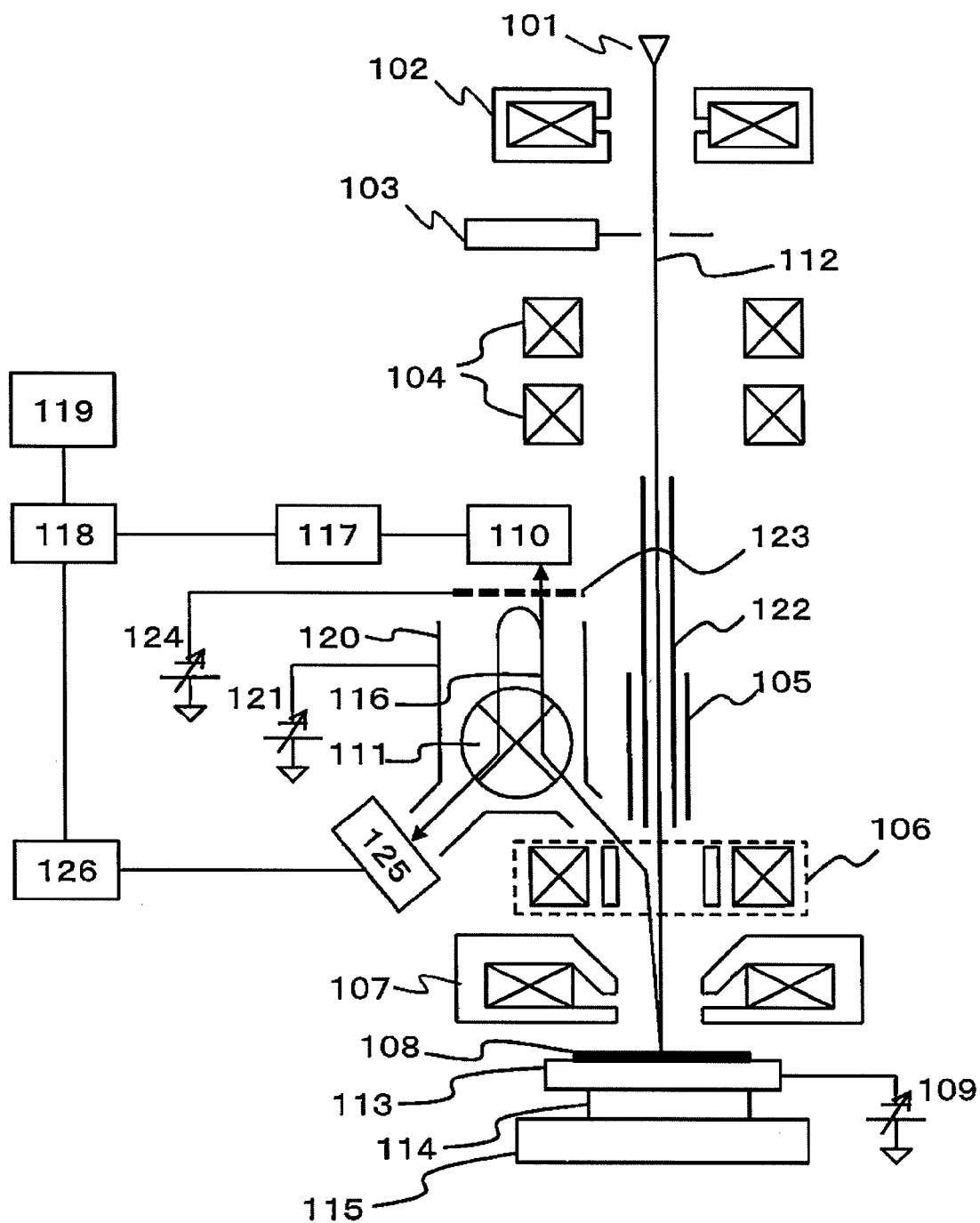
FIG. 1 is a schematic overall configuration diagram of a scanning electron microscope (SEM) according to a first embodiment.

FIG. 1 is a diagram illustrating a configuration of an SEM according to the present embodiment. In the SEM of FIG. 1, primary electrons 112 generated in an electronic source 101 are condensed by a first condenser lens 102, pass through an aperture 103, are deflected in a deflector 104, pass through an electric field shield 122, pass an ExB deflector 106, are condensed narrow by an object lens 107, and are then incident on sample 108.

The sample 108 is placed on a sample holder 113, and the sample 108 and the sample holder 113 are electrically contacted. A retarding voltage ($V_R$) can be applied to the sample holder 113 by a retarding power source 109, and the primary electrons 112 are decelerated by the retarding voltage and are incident on the sample 108. Hereinafter, the voltage applied by the retarding power source 109 is $V_R$ (<0).

A sample stage 115 can be moved in an xy plane where an optical axis of the primary electrons 112 is z axis. Further, the sample holder 113 and the stage 114 are electrically insulated by an insulating material 114. Secondary electrons 116 generated due to irradiation of the sample 108 with the primary electrons 112 are accelerated by the retarding voltage, and are deflected outside the optical axis of the primary electrons 112 by the ExB deflector 106.

Figure 2:
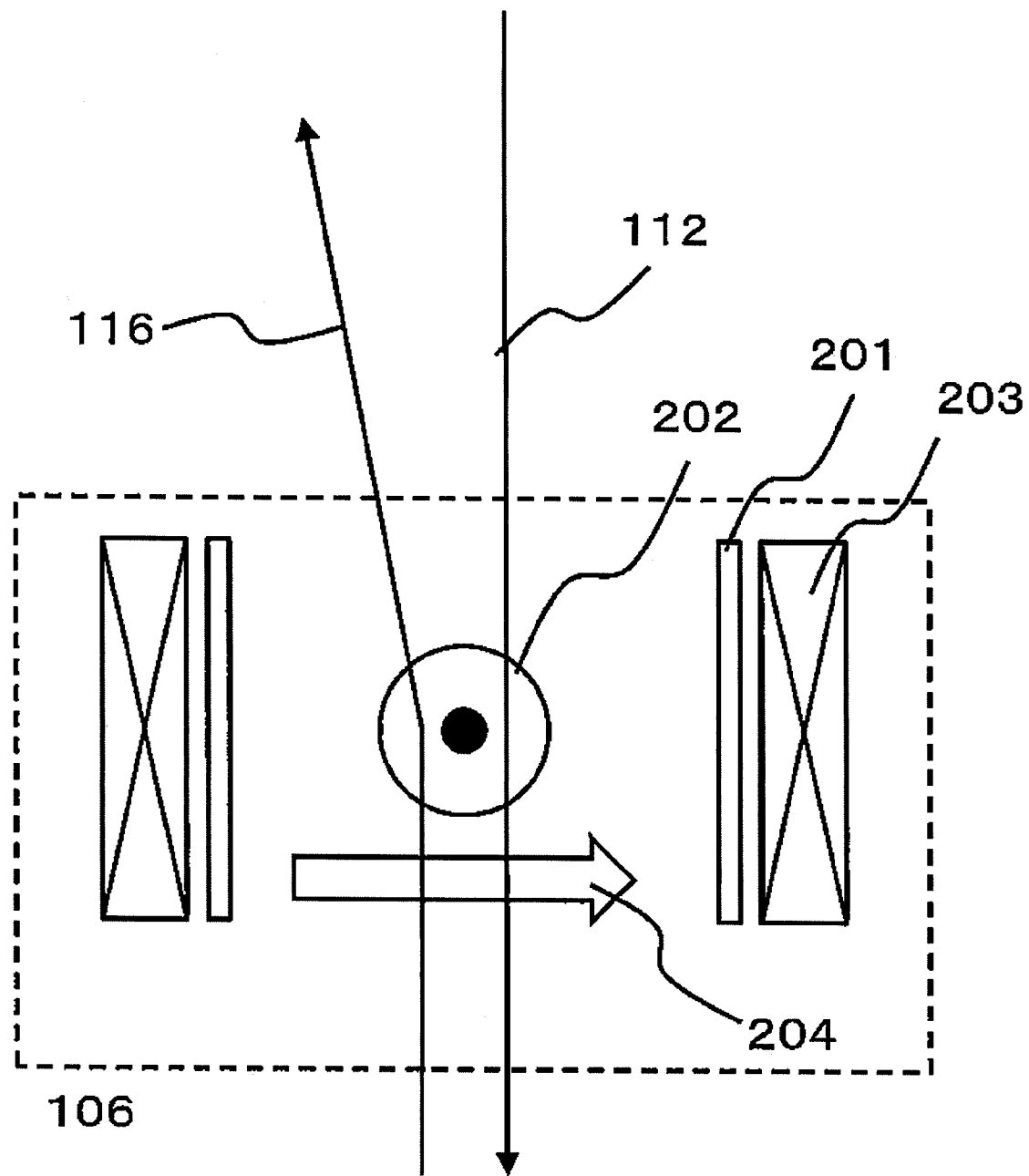
FIG. 2 is a schematic diagram of an ExB deflector.

Here, details of the ExB deflector 106 will be described with reference to FIG. 2. The ExB deflector 106 is configured from an ExB electrode 201 and an ExB coil 203, and has a characteristic that an ExB electric field 204 and an ExB magnetic field 202 caused by an ExB electrode 201 are perpendicular to each other. In addition, the magnitudes of the ExB electric field 204 and the ExB magnetic field 202 satisfy a condition that the primary electrons 112 are not deflected in the ExB deflector 106 (hereinafter, "Wein condition"). In the present embodiment, description will be given on the assumption that the direction of the ExB electric field 204 is a direction of the arrow in FIG. 2, and the ExB magnetic field 202 works from the back to the front of the paper surface.

Figure 3:
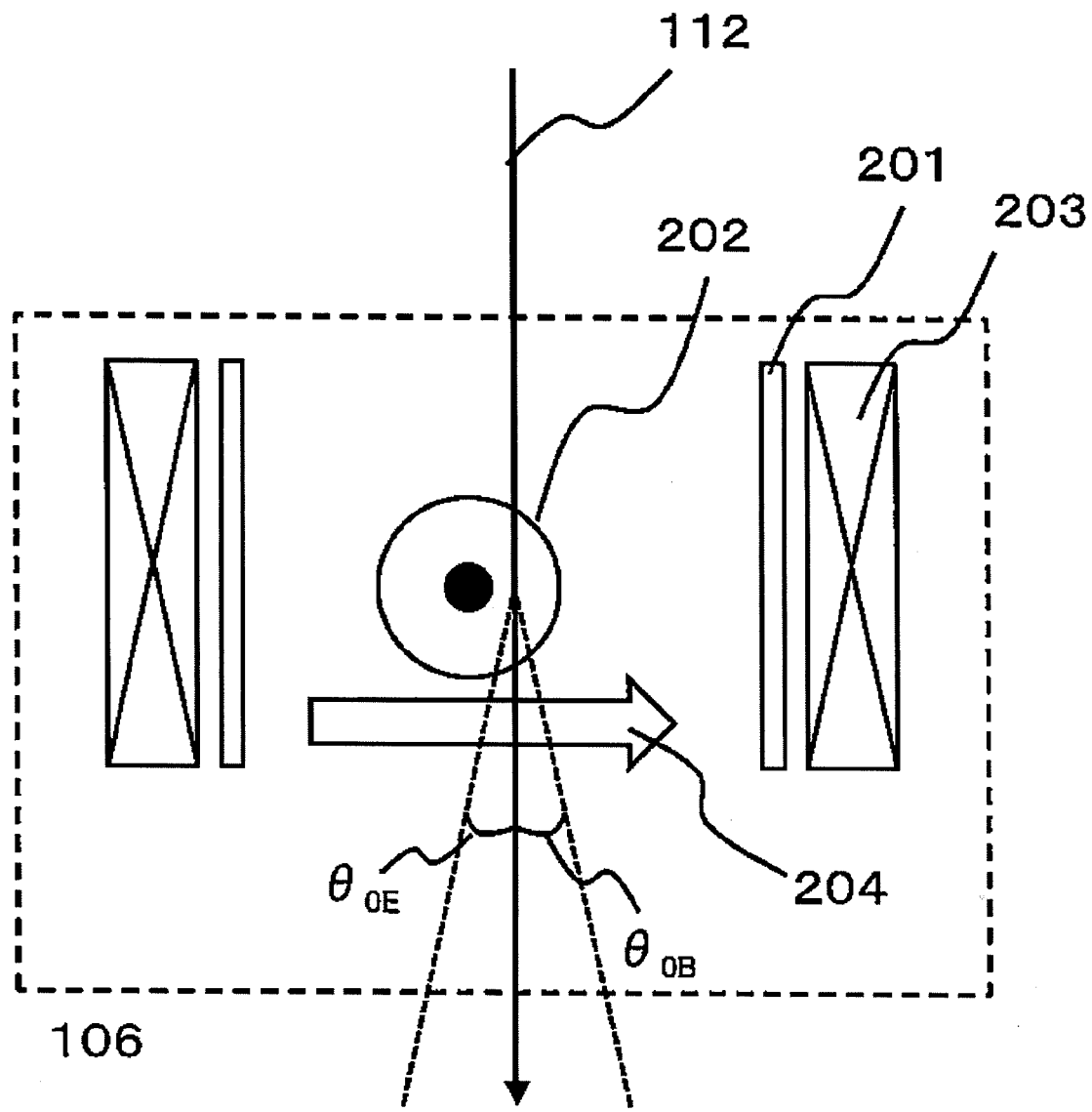
FIG. 3 is a diagram for describing deflection action to a primary electron in the ExB deflector.

Here, when an angle by which the primary electrons 112 having the energy $-eV_0$ ($V_0$<0) are deflected in the ExB electric field 204 is $\theta_{0E}$, and an angle by which the primary electrons 112 are deflected in the ExB magnetic field 202 is $\theta_{0B}$ (FIG. 3), the magnitudes of $\theta_{0E}$ and $\theta_{0B}$ are expressed by the following formula 1:

[Mathematical Formula 1]

$$\theta_{0E} = \frac{E_0}{-2V_0} \tag{1}$$

[Mathematical Formula 2]

$$\theta_{0B} = \sqrt{\frac{-e}{2m_e V_0}} B_0 \tag{2}$$

Here, "e" is the elementary charge, "$m_e$" is mass of electrons, "$E_0$" is the ExB electric field 204, and "$B_0$" is the ExB magnetic field 202. The length that the ExB electric field 204 and the ExB magnetic field 202 act on is l. From the formulae (1) and (2), the relationship of $E_0$ and $B_0$ under Wein condition is expressed by the following formula:

[Mathematical Formula 3]

$$E_0 \sqrt{\frac{-2eV_0}{m_e}} B_0 \tag{3}$$

Figure 4:
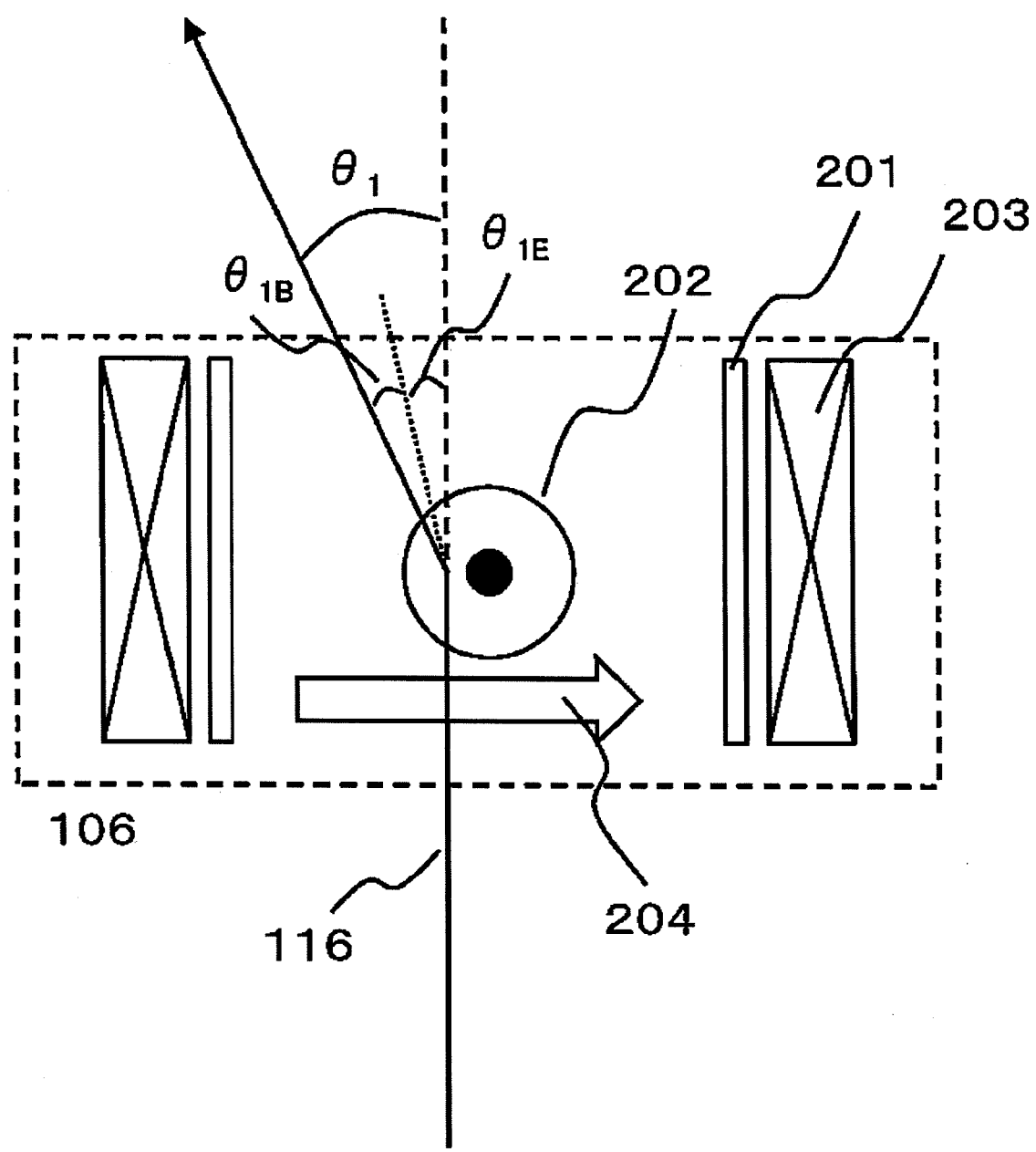
FIG. 4 is a diagram for describing deflection action to a secondary electron in the ExB deflector when Wein condition is satisfied.

In a case where Wein condition is satisfied, when an angle by which the secondary electrons 116 having the energy $-eV_1$ ($V_1$<0) are deflected in the ExB electric field 204 is $\theta_{1E}$, and an angle by which the secondary electrons are deflected by the ExB magnetic field 202 is $\theta_{1B}$ (FIG. 4), the magnitudes of $\theta_{1E}$ and $\theta_{1B}$ can be expressed by the following formulae:

[Mathematical Formula 4]

$$\theta_{1E} = \frac{E_0}{-2V_1} \tag{4}$$

[Mathematical Formula 5]

$$\theta_{1B} = \sqrt{\frac{-e}{2m_e V_1}} B_0 \tag{5}$$

Since the directions of $\theta_{1E}$ and $\theta_{1B}$ are the same, the angle $\theta_1$ by which the secondary electrons 116 are deflected in the ExB deflector 106 can be expressed as follows according to the formulae (3) to (5):

[Mathematical Formula 6]

$$\theta_1 = \theta_{1E} + \theta_{1B} = \sqrt{\frac{e}{2m_e}} B_0 \frac{\sqrt{-V_0} + \sqrt{-V_1}}{-V_1}. \quad (6)$$

As described above, under Wein condition, the primary electrons 112 are not deflected in the ExB deflector 106, and the secondary electrons 116 are deflected in the ExB deflector 106 by the angle expressed by the formula (6). Note that, in the present embodiment, $E_0$ and $B_0$ are set so that $\theta_1$ becomes about 30°.

The secondary electrons 116 deflected in the ExB deflector 106 are incident on a secondary electron decelerating electrode 120 and a magnetic generator 111. The deflection amount of the secondary electrons 116 in the secondary electron decelerating electrode 120 and the magnetic generator 111 will be described with reference to FIG. 5.

Figure 5:
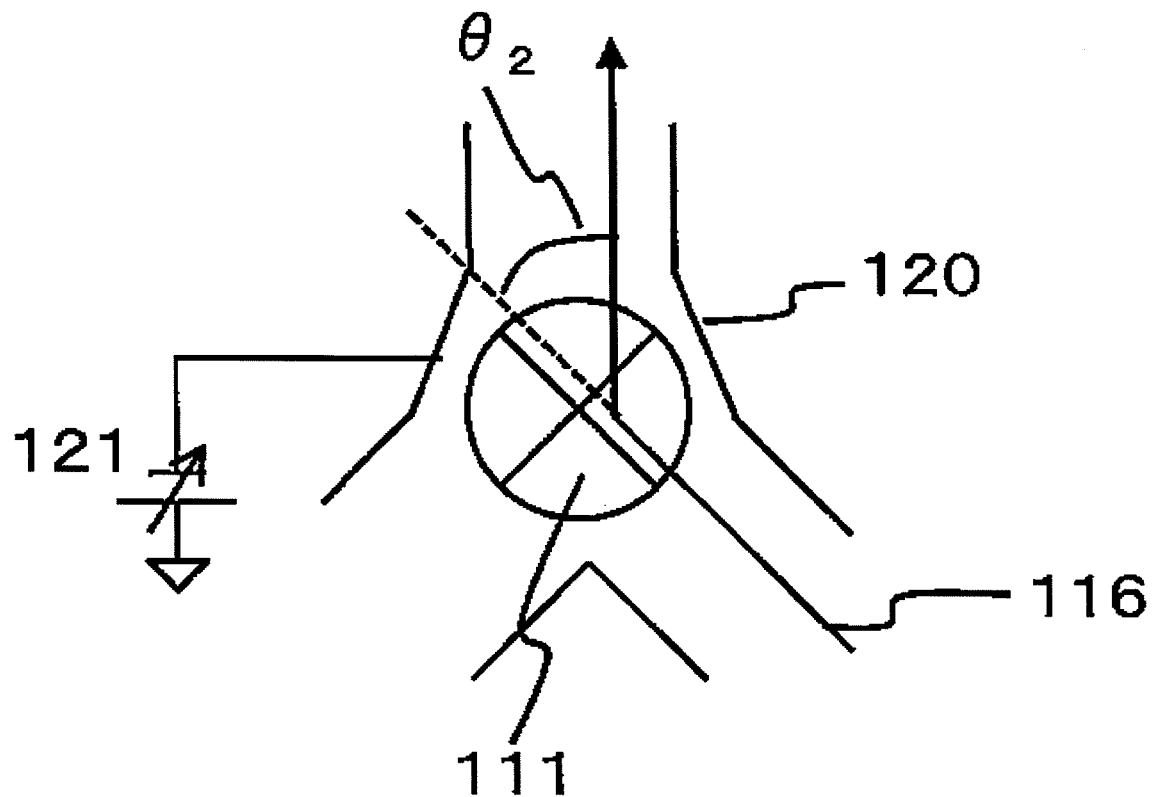
FIG. 5 is a diagram for describing a locus of a secondary electron deflected by a magnetic field of a magnetic generator.

The secondary electron decelerating electrode 120 in FIG. 5 is configured from a conductor, and has openings for allowing the secondary electron 116 to pass through in three places. A voltage $V_d$ (<0) can be applied to the secondary electron decelerating electrode 120 by a secondary electron deceleration power source 121. When the secondary electrons 116 having the energy $-eV_1$ ($V_1<V_d<0$) enters the secondary electron decelerating electrode 120, the secondary electrons 116 are decelerated by the voltage $V_d$, thus the energy becomes $-e(V_1-V_d)$.

The decelerated secondary electrons 116 are deflected by a magnetic field generated by the magnetic generator 111. In the present embodiment, the magnetic generator 111 is configured from a magnetic substance, around which a coil is wound, and a range to affect the locus of the secondary electrons 116 by the magnetic field generated by the magnetic generator 111 falls within a range to affect the locus of the secondary electrons 116 by the decelerating field of the secondary electron decelerating electrode 120. In the present embodiment, description will be given on the assumption that the direction of the magnetic field generated by the magnetic generator 111 works in the direction from the front to the back of the paper surface. Note that the configuration of the magnetic generator 111 is not limited to the one in which a coil is wound around a magnetic substance, and can be substituted by other devices that can generate the magnetic field.

When the magnitude of the magnetic field generated by the magnetic generator 111 is $B_1$, and the length that $B_1$ acts on is 1, a deflection angle $\theta_2$ of the secondary electrons 116 in the magnetic generator 111 is expressed by the following formula:

[Mathematical Formula 7]

$$\theta_2 = \sqrt{\frac{-e}{2m(V_1 - V_d)}} B_1 \quad (7)$$

If the secondary electron decelerating electrode 120 is not used, the deflection angle $\theta_2$ is expressed by the following formula (8):

[Mathematical Formula 8]

$$\theta_2 = \sqrt{\frac{-e}{2mV_1}} B_1 \quad (8)$$

It is found that the deflection angle $\theta_2$ is larger when the secondary electrons 116 are decelerated by the decelerating electrode 120 than the case where the decelerating electrode 120 is not used even in the same magnetic field. When the retarding voltage $V_R$ becomes higher, the energy $-eV_1$ of the secondary electrons 116 when being incident on the secondary electron decelerating electrode 120 becomes higher. Therefore, to maintain the deflection angle $\theta_2$ constant when secondary electron decelerating electrode 120 is not used, a large magnetic field is required. Meanwhile, when the secondary electron decelerating electrode 120 illustrated in the present embodiment is used, the deflection angle $\theta_2$ can be obtained without changing the magnetic field by controlling $V_d$ so as to keep the $|V_R-V_d|$ constant even if the retarding voltage $V_R$ is varied. In the present embodiment, $\theta_2$ is set to about 30°.

If the magnetic field of the magnetic generator 111 is leaked out on the optical axis of the primary electron 112, the aberration of the primary electron 112 is increased, and the spatial resolution is deteriorated. Therefore, it is important to shield the magnetic field of the magnetic generator 111. Therefore, in the present embodiment, a magnetic field shield 105 is disposed around the optical axis of the primary electron 112. The material of the magnetic field shield 105 is a magnetic substance such as permalloy or ferrite in order to shield the magnetic field of the magnetic generator 111. Similarly, when the electric field of the secondary electron decelerating electrode 120 is leaked out on the optical axis of the primary electron 112, the aberration of the primary electron 112 is increased, and the spatial resolution is deteriorated. To prevent it, in the present embodiment, an electric field shield 122 is also disposed around the optical axis of the primary electron 112. The electric field shield 122 is a conductor, and is grounded.

The secondary electrons 116 having passed through the secondary electron decelerating electrode 120 enter the energy filter A123. In the present embodiment, the energy filter A123 is disposed between the secondary electron decelerating electrode 120 and the detector A110. The energy filter A123 is configured from a conductive grid, the number of grids is from one to plural pieces, and at least one grid is connected to the filter power source A124.

Figure 6:
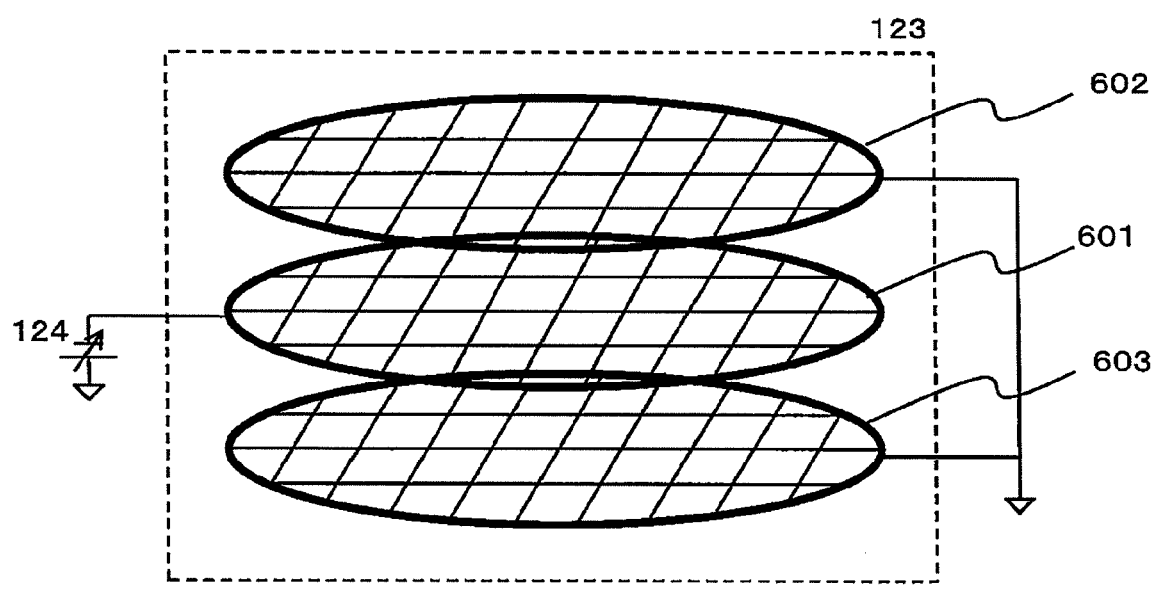
FIG. 6 is a schematic diagram of an energy filter.

As illustrated in FIG. 6, specifically, the energy filter A123 has a configuration that the electrode grid 601 connected to the filter power source A124 is sandwiched by a ground grid A602 and a ground grid B603. The voltage $V_{F1}$ (<0) is applied to the electrode grid 601 by the filter power source A124, so that only the secondary electrons 116 having $-eV_{F1}$ or more energy.

The ground grids A602 and B603 have a function to shield the voltage applied to the electrode grid so as not to be leaked outside the energy filter A123. In the present embodiment, the energy filter A123 is configured from three grids. However, a plurality of grids connected to the filter power source A124 may be employed. The ground grid A602 and the ground grid B603 can be substituted by a grounded cylindrical electrode.

Figure 7:
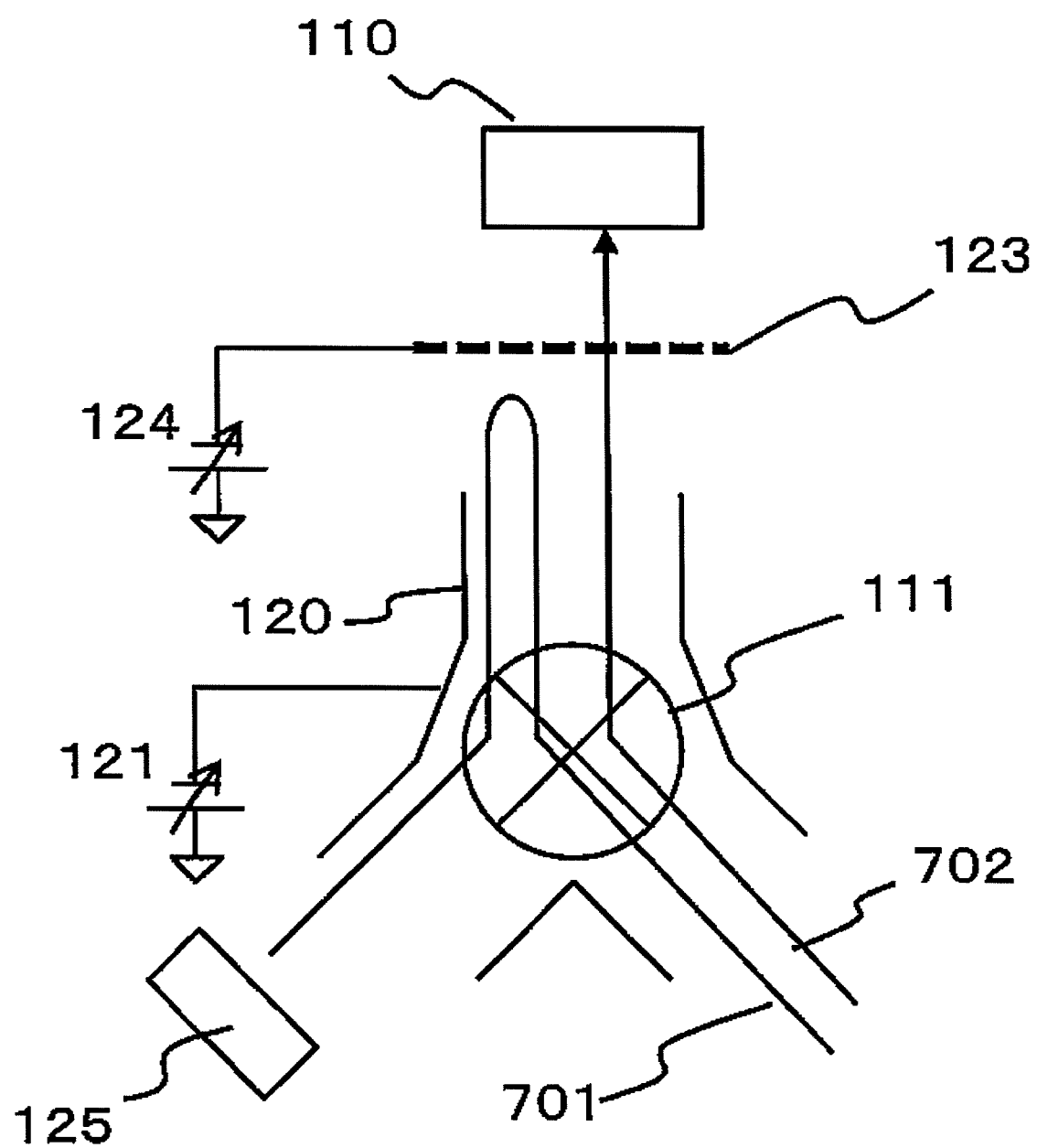
FIG. 7 is a diagram for describing loci of secondary electrons passing through and reflected at an energy filter A.

Next, the loci of the secondary electrons that pass through and are reflected at the energy filter A123 and a method of detecting the secondary electrons will be described with reference to FIG. 7. FIG. 7 illustrates loci of the secondary electrons of a case in which the voltage $V_{F1}$ (<0) is applied to the electrode grid 601 by the filter power source A124, the secondary electrons B702 having $-eV_B$ ($V_B$<0) energy and the secondary electron A701 having $-eV_A$ ($V_A$<0) energy are incident on the energy filter A123. Here, $-eV_A$<$-eV_{F1}$<$-eV_B$. The secondary electron B702 can pass through the energy filter A123, and thus the secondary electron B702 can be detected in the detector A110. Meanwhile, the secondary electrons A701 cannot pass through the energy filter A123, and are reflected. The secondary electron A701 reflected at the energy filter A123 is, when passing through the magnetic generator 111, deflected into a direction opposite to the direction of when the secondary electron A701 is incident on the magnetic generator 111.

Therefore, a difference is caused between the loci of the secondary electrons A701 at being incident on and at being reflected at the energy filter A123, and the secondary electron A701 can be detected in the detector B125. That is, when the configuration of the present embodiment is used, the secondary electrons having the $-eV_{F1}$ or more energy can be detected in the detector A110, and the secondary electrons having the $-eV_{F1}$ or less energy can be detected in the detector B125, at the same time.

Figure 17:
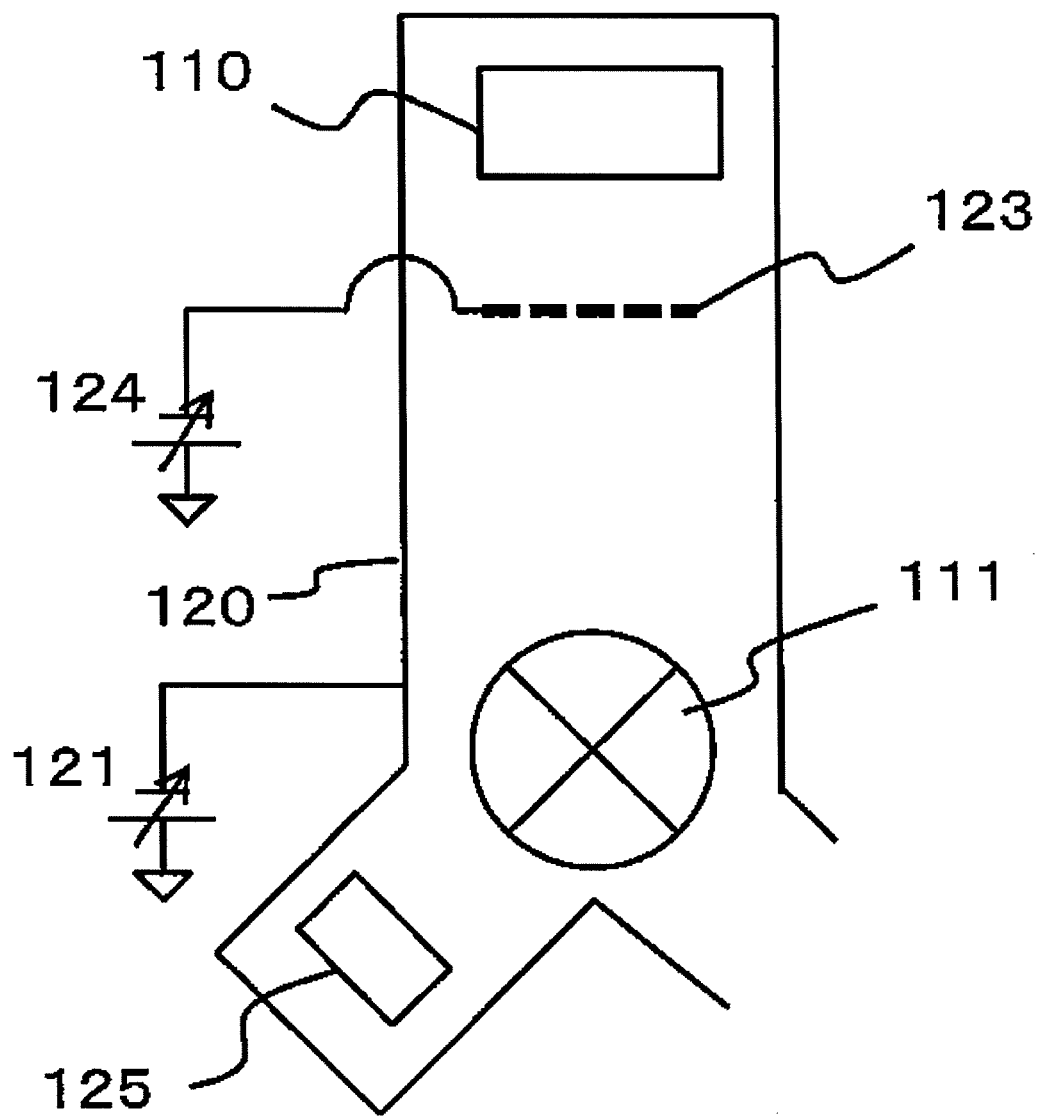
FIG. 17 is a diagram for describing a configuration in which a detector and an energy filter are disposed inside a secondary electron decelerating electrode.

The present embodiment has a configuration in which the detectors A110 and B125, and the energy filter A123 are disposed outside the secondary electron decelerating electrode 120. However, as illustrated in FIG. 17, the detectors A110 and B125, and the energy filter A123 may be disposed inside the secondary electron decelerating electrode 120.

In the present embodiment, for the detectors A110 and B125, an Everhart-Thornley detector configured from a scintillator, a light guide, and a photomultiplier tube is used. This detector has high detection sensitivity under the present condition. However, the effects of the present embodiment can be obtained even if other electron beam detectors are used for the detectors A110 and B125, such as a semiconductor detector or a micro channel plate.

To form an SEM image, the primary electrons 112 are deflected in the deflector 104 so that the primary electrons 112 scan the sample 108, and signals detected in the detector A110 are sent to the image processor A117, and signals detected in the detector B125 are sent to the image processor B126, respectively. The image processor A117 and the image processor B126 form SEM images as maps of detection signals in synchronization with scanning signals.

Hereinafter, the SEM image formed in the image processor A117 is an SEM image A, and the SEM image formed in the image processor B126 is an SEM image B. The SEM images A and B are stored in the image memory unit 118, and the user can confirm the images in the image display unit 119 at any time.

Hereinafter, a method of setting the voltage $V_{F1}$ of the filter power source A124 will be described. As described in the related art, the secondary electrons 116 include a "true" secondary electron and a reflected electron. Here, while "true" secondary electron has 50 eV or less energy, the reflected electron has the same energy as the primary electron 112.

Figure 8:
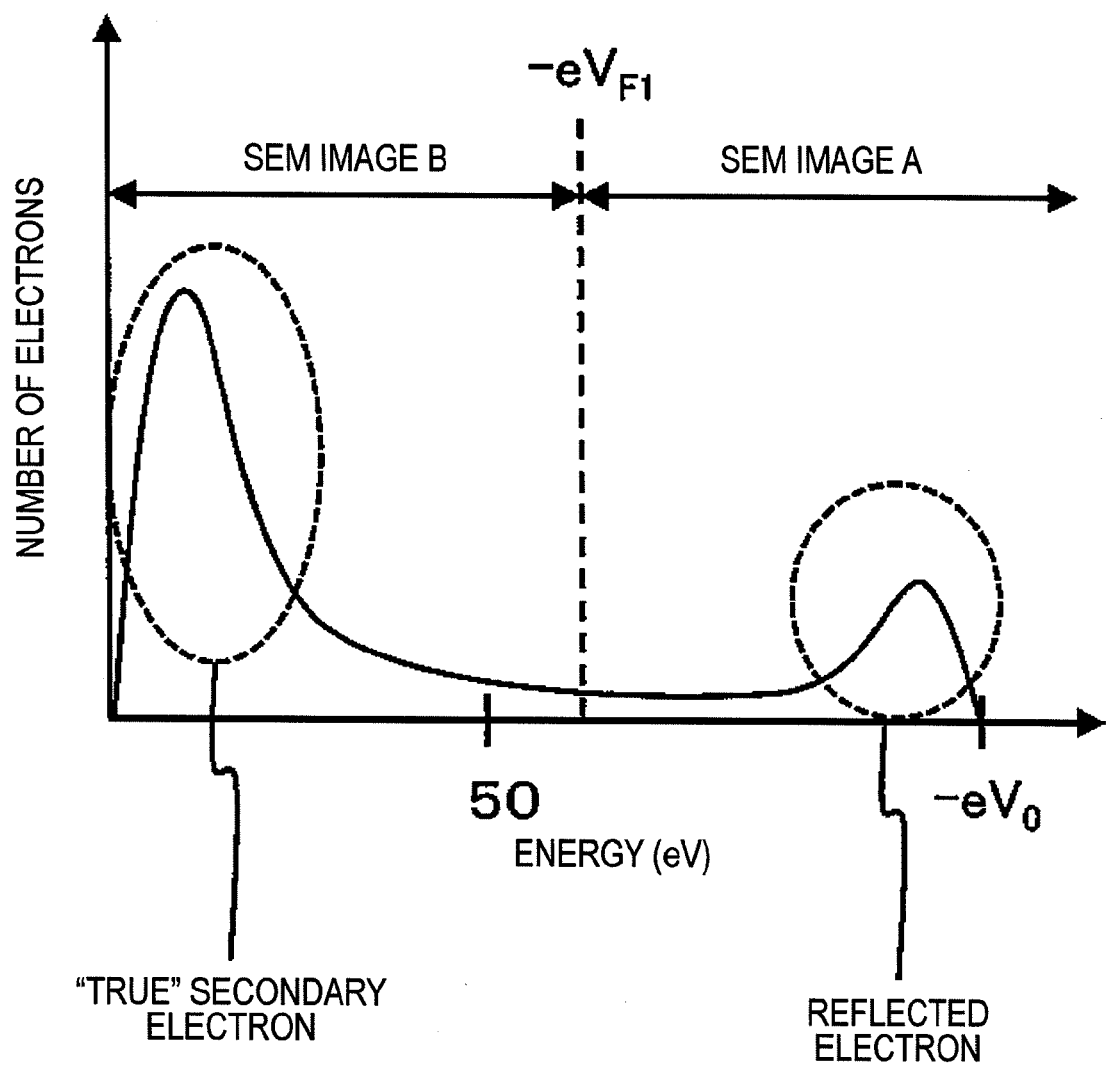
FIG. 8 is a graph for describing energy distribution of secondary electrons and energy regions of SEM images A and B.

As illustrated in FIG. 8, energy distribution of the secondary electrons 116 obtained when the energy of the primary electron 112 is $-eV_0$ is shown. In the present embodiment, the energy $-eV_0$ of the primary electron 112 is used in a range from several hundreds eV to several thousands eV, and thus energy regions of the "true" secondary electrons and the reflected electrons are significantly different.

Therefore, if the $V_{F1}$ is set to about −50 V, the SEM image A becomes an image by the reflected electrons, and the SEM image B becomes an image by the "true" secondary electrons.

Note that, when the voltage $V_R$ (<0) has been applied to the sample 108 by the retarding power source 109, the energy distribution in FIG. 8 has an offset of $-eV_R$. Therefore, to separate the "true" secondary electrons and the reflected electrons, it is necessary to set $V_{F1}$ to about $V_R$−50 V.

Further, it is known that the "true" secondary electrons reflect a surface form of the sample 108 and a difference in the charged state. Especially, the difference in the charged state appears as a difference in the energy distribution of the secondary electrons 116. Therefore, the difference in the charged state can be visualized using the present invention. An example thereof includes an oxide film hole in the manufacturing process of semiconductors, as illustrated in FIG. 9.

Figure 9:
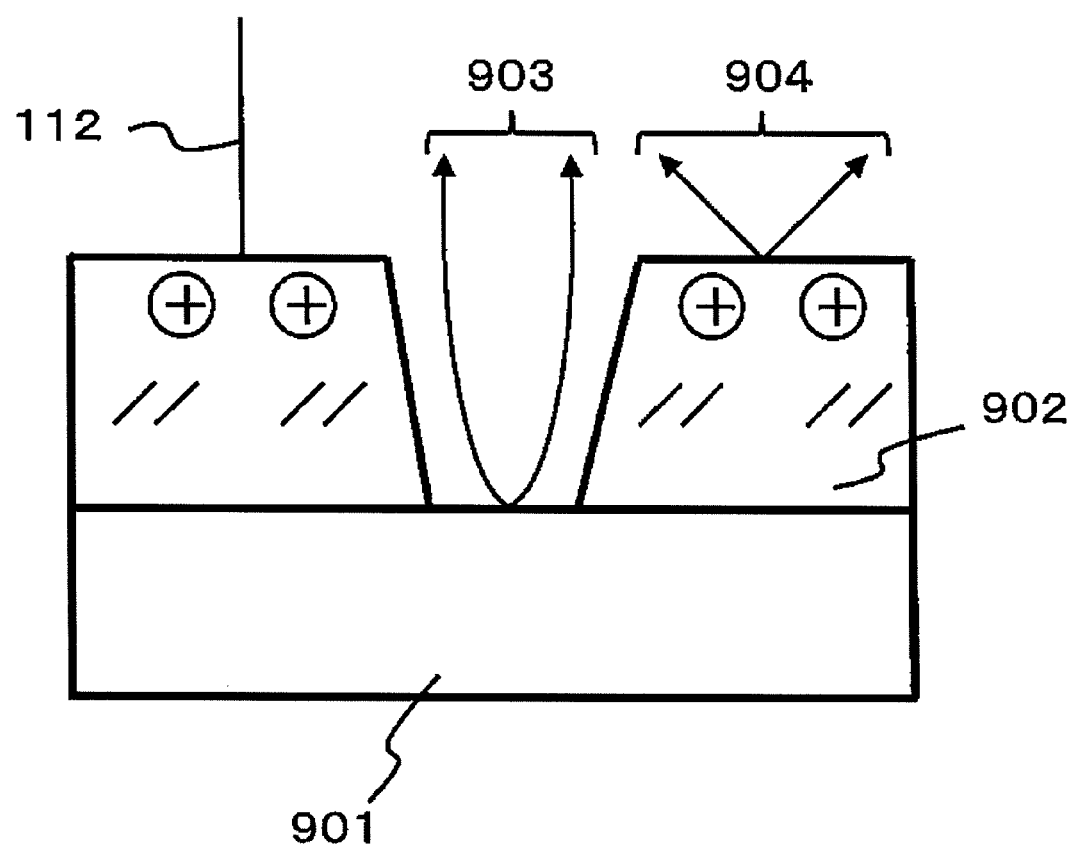
FIG. 9 is a schematic diagram of an oxide film hole.

FIG. 9 illustrates a cross sectional view of an oxide film hole. An insulating film 902 is layered on a conductor 901, and a hole is made in the insulating film 902. When the insulating film 902 is irradiated with the primary electrons 112, the insulating film 902 is charged. Positive/negative of charging is determined by secondary electron generation efficiency defined by (an amount of "true" secondary electrons)/(an amount of primary electrons). While the secondary electron generation efficiency is smaller than 1.0, the insulating film 902 is charged negative, the secondary electron generation efficiency is larger than 1.0, the insulating film 923 is charged positive. The secondary electron generation efficiency is determined by the energy of the primary electrons 112 when being incident on the insulating film 902. The secondary electron generation efficiency of an insulating material, which is typically used in the semiconductor devices, exceeds 1.0, when the energy is from 500 to 1000 eV.

Hereinafter, a case in which the insulating film 902 is charged positive by $\Delta V$ will be described. Secondary electrons 903 emitted from the conductor 901 are raised by the positive charging of the insulating film 902, and can get out of the hole. Therefore, when observing the oxide film hole with a normal SEM, an SEM image as illustrated in FIG. 10C is obtained.

Figure 10A:
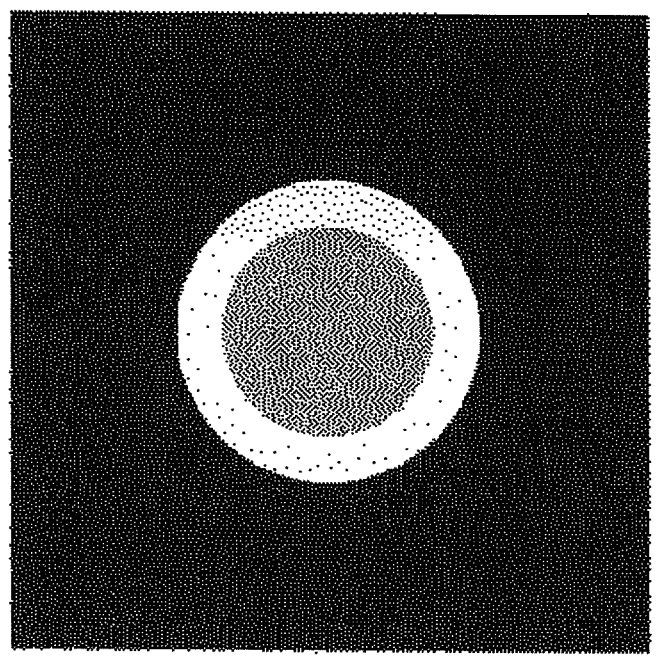
FIG. 10A is a schematic diagram A of an SEM image obtained when an oxide film hole is observed with an SEM according to the first embodiment.
Figure 10B:
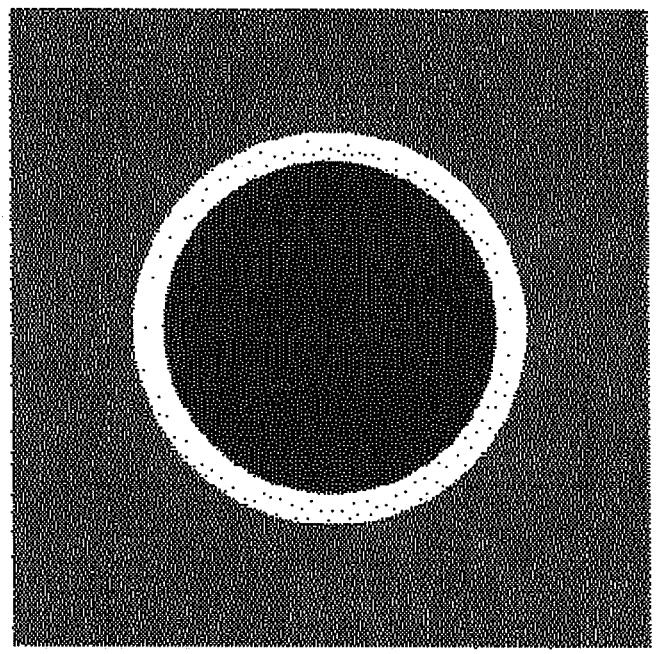
FIG. 10B is a schematic diagram B of an SEM image obtained when an oxide film hole is observed with the SEM according to the first embodiment.
Figure 10C:
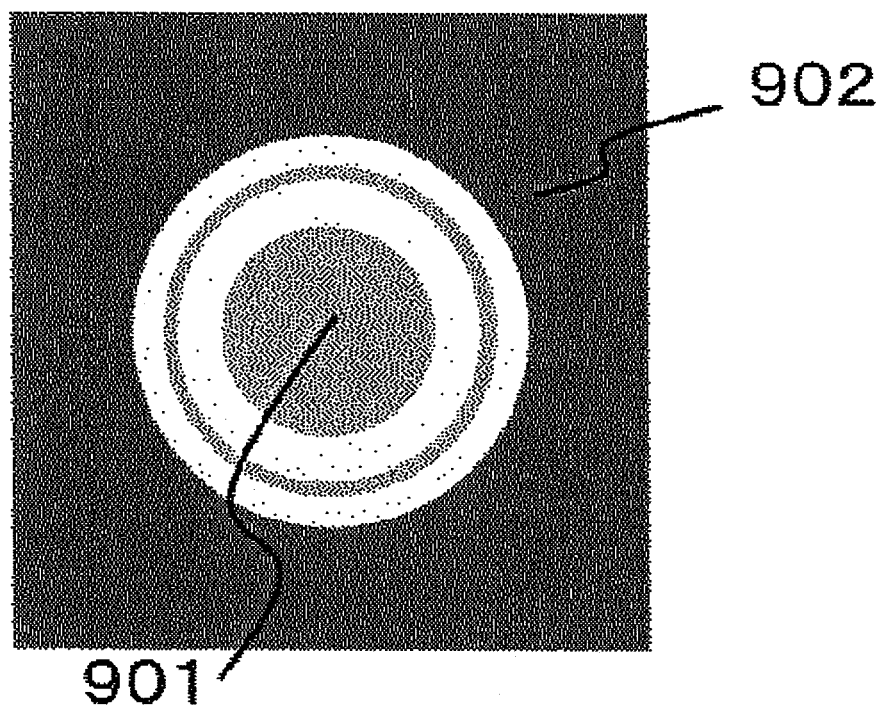
FIG. 10C is a schematic diagram C of an SEM image obtained when an oxide film hole is observed with the SEM according to the first embodiment.

In FIG. 10C, both of the secondary electrons 903 emitted from the conductor 901 and secondary electrons 904 emitted from the insulating film 902 constitute the SEM image, and thus the contrast between the outside and inside of the hole cannot be obtained, and high accuracy cannot be obtained when the diameter of the hole is measured.

However, as illustrated in FIGS. 10A and 10B, in the SEM illustrated in the present embodiment, the inside and outside of the hole are separated, and an image can be obtained. Hereafter, a reason thereof is described. The conductor 901 has the same potential as the retarding voltage VR, and the potential of the insulating film 902 is VR+$\Delta$V. Therefore, the energy of when the secondary electrons 903 and the secondary electrons 904 are incident on the energy filter A123 is different by e$\Delta$V.

Figure 18:
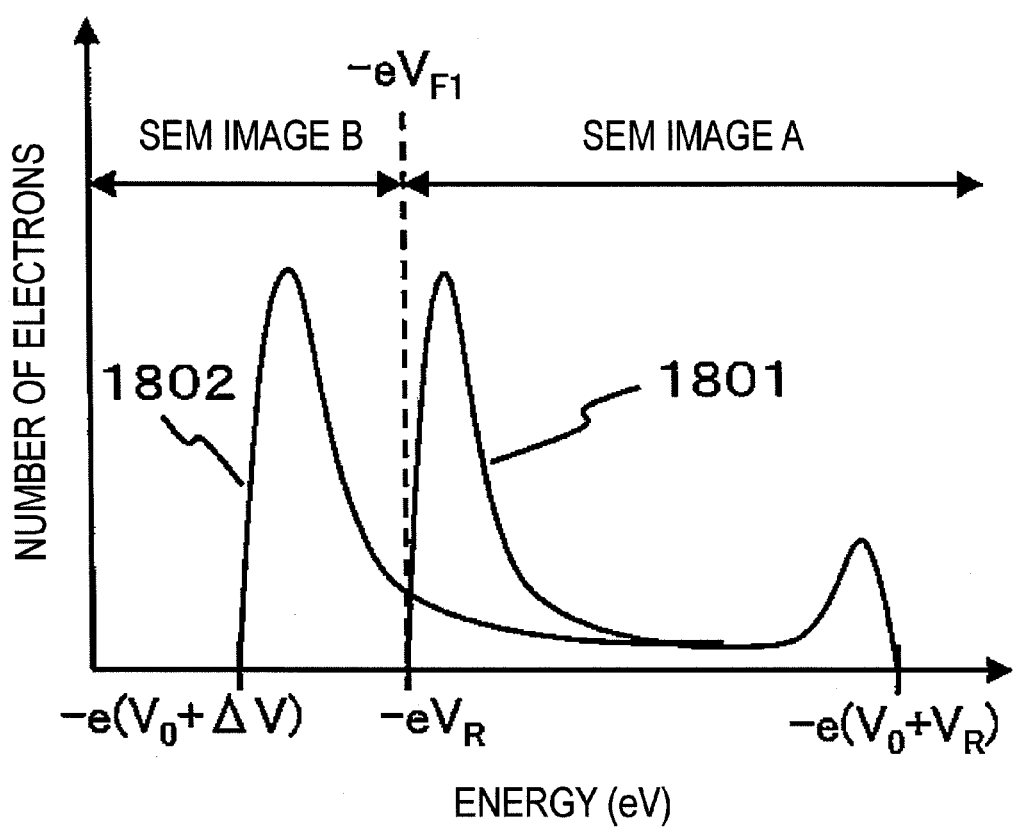
FIG. 18 is a diagram for describing differences in energy distribution of secondary electrons generated in a conductor and an insulating film.

That is, as illustrated in FIG. 18, energy distribution 1802 of the secondary electrons 904 generated in the insulating film 902 is shifted by e$\Delta$V with respect to the energy distribution 1801 of the secondary electrons 903 generated in the conductor 901. Therefore, by setting the voltage $V_{F1}$ of the filter power source A124 to around $V_R$, the secondary electrons 903 can be detected in the detector A110 and the secondary electrons 904 can be detected in the detector B125, respectively.

In the present embodiment, the user can measure the dimension of a pattern from the SEM images A and B. For example, the user can measure the diameters of the inside and outside of the holes, respectively, using FIGS. 10A and 10B.

Figure 19:
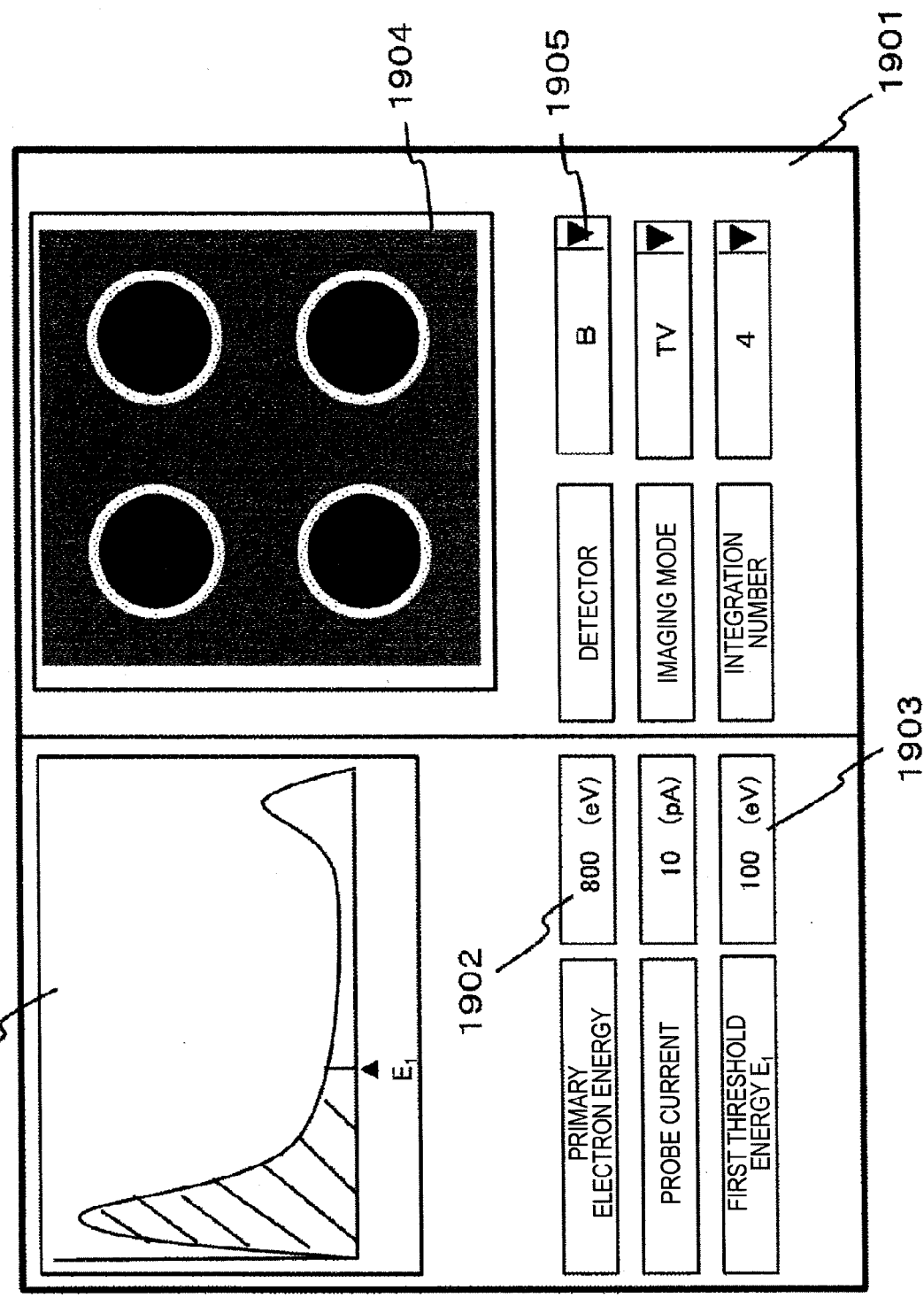
FIG. 19 is a diagram for describing a GUI screen for setting a voltage to the energy filter A.

Then, as illustrated in FIG. 19, the user can set the voltage $V_{F1}$ of the filter power source A124 and the energy of the primary electrons 112 on the GUI 1901. The GUI 1901 is displayed on the image display unit 119. $V_R$ is set such that a value input to a primary electron energy input unit 1902 and the energy of the primary electrons 112 become equal. Further, $V_{F1}$ is set to the following voltage using a value $E_1$ input to a first threshold input unit 1903 and $V_R$.

[Mathematical Formula 9]

$$V_{F1} = V_R - E_1 \qquad (9)$$

With an SEM image selection button 1905, which of the SEM images A and B is displayed on the SEM image display unit 1904 can be selected. From which secondary electrons of which energy region the SEM image selected through the SEM image selection button 1905 is formed is displayed by the slanted line portion in a detection energy range display unit 1906.

Although details are omitted, the current amount of the primary electron 112, the method of capturing the SEM images A and B, the number of frames, and the like can be set on the GUI 1901. Note that the configuration of the GUI 1901 disclosed in the present embodiment is a mere example, and is not limited to this example. For example, the primary electron energy input unit 1902 or the first threshold input unit 1903 may employ a slide bar system instead of inputting of numerical values.

Second Embodiment

Figure 11:
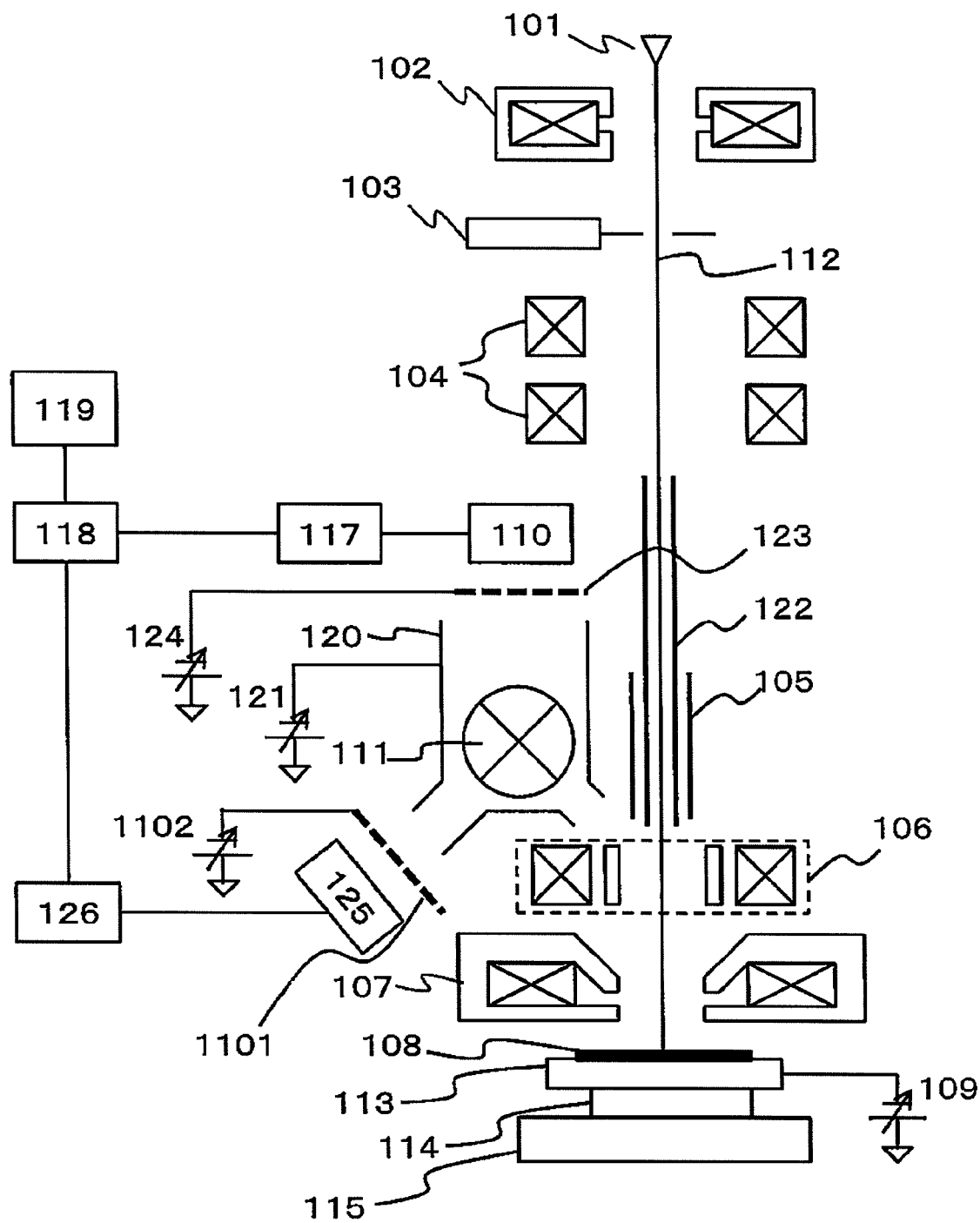
FIG. 11 is a schematic overall configuration diagram of a scanning electron microscope (SEM) according to a second embodiment.

A configuration of a second embodiment will be illustrated in FIG. 11. In the present embodiment, an energy filter B1101 and a filter power source B1102 are added to the first embodiment. Here, configurations of the energy filter B1101 and the filter power source B1102 are equal to that of the energy filter A123 and the filter power source A (FIG. 6), and the energy filter B1101 is disposed at the magnetic generator 111 side of the detector B125.

The first embodiment has a configuration in which the secondary electrons passing through the energy filter A123 and the secondary electrons reflected at the energy filter A123 are respectively detected in the detector A110 and the detector B125. Meanwhile, in the present embodiment, detection of secondary electrons in an arbitrary range, in other words, bandpath detection becomes possible.

Figure 12:
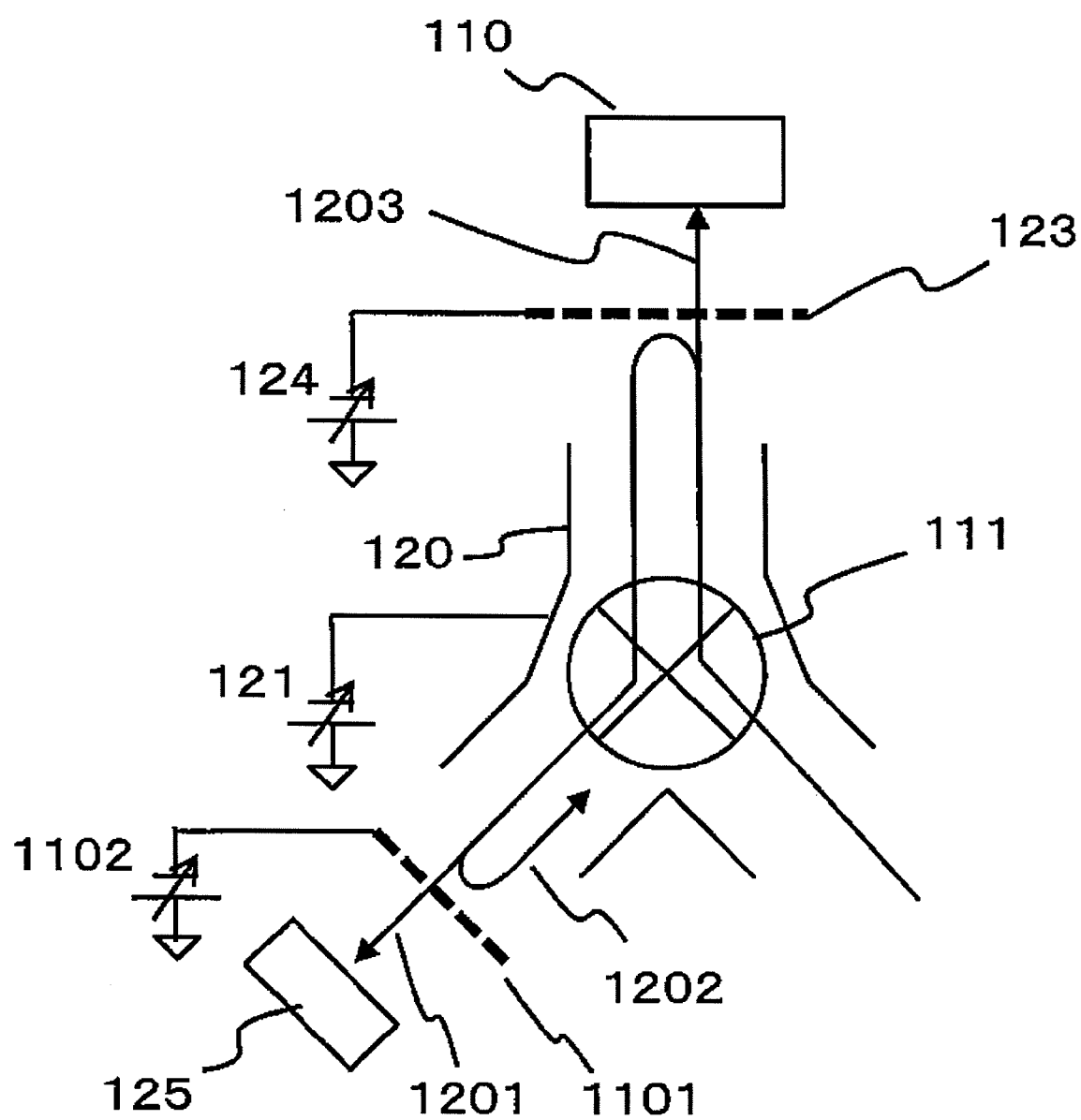
FIG. 12 is a diagram for describing loci of secondary electrons passing through and reflected at energy filters A and B.

A reason why the bandpath detection becomes possible in the present embodiment will be described with reference to FIG. 12. In the present embodiment, a voltage $V_{F1}$ (<0) is applied to the energy filter A123 by the filter power source A124, a voltage $V_{F2}$ (<0) is applied to the energy filter B1101 by the filter power source B1102. Here, to realize the bandpass detection, it is necessary to satisfy the following relationship.

[Mathematical Formula 10]

$$V_{F1} < V_{F2} < 0 \qquad (10)$$

Consider a case where secondary electrons C1201 having energy in a range from $-eV_{F2}$ to $-eV_{F1}$, secondary electrons D1202 having $-eV_{F2}$ or less energy, and secondary electrons E1203 having $-eV_{F1}$ or more energy are incident on the secondary electron decelerating electrode 120. The secondary electrons E1203 can pass through the energy filter A123, but the secondary electrons C1201 and D1202 are reflected at the energy filter A123.

The reflected secondary electrons C1201 and D1202 are deflected in the magnetic generator ill, and are then incident on the energy filter B1101. Here, while the secondary electrons C1201 pass through the energy filter B1101 and are detected in the detector B125, the secondary electrons D1202 are reflected at the energy filter B1101. That is, in the detector B125, only the secondary electrons C1401 having the energy range of $-eV_{F2}$ to $-eV_{F1}$ can be subjected to the bandpath detection.

Figure 13:
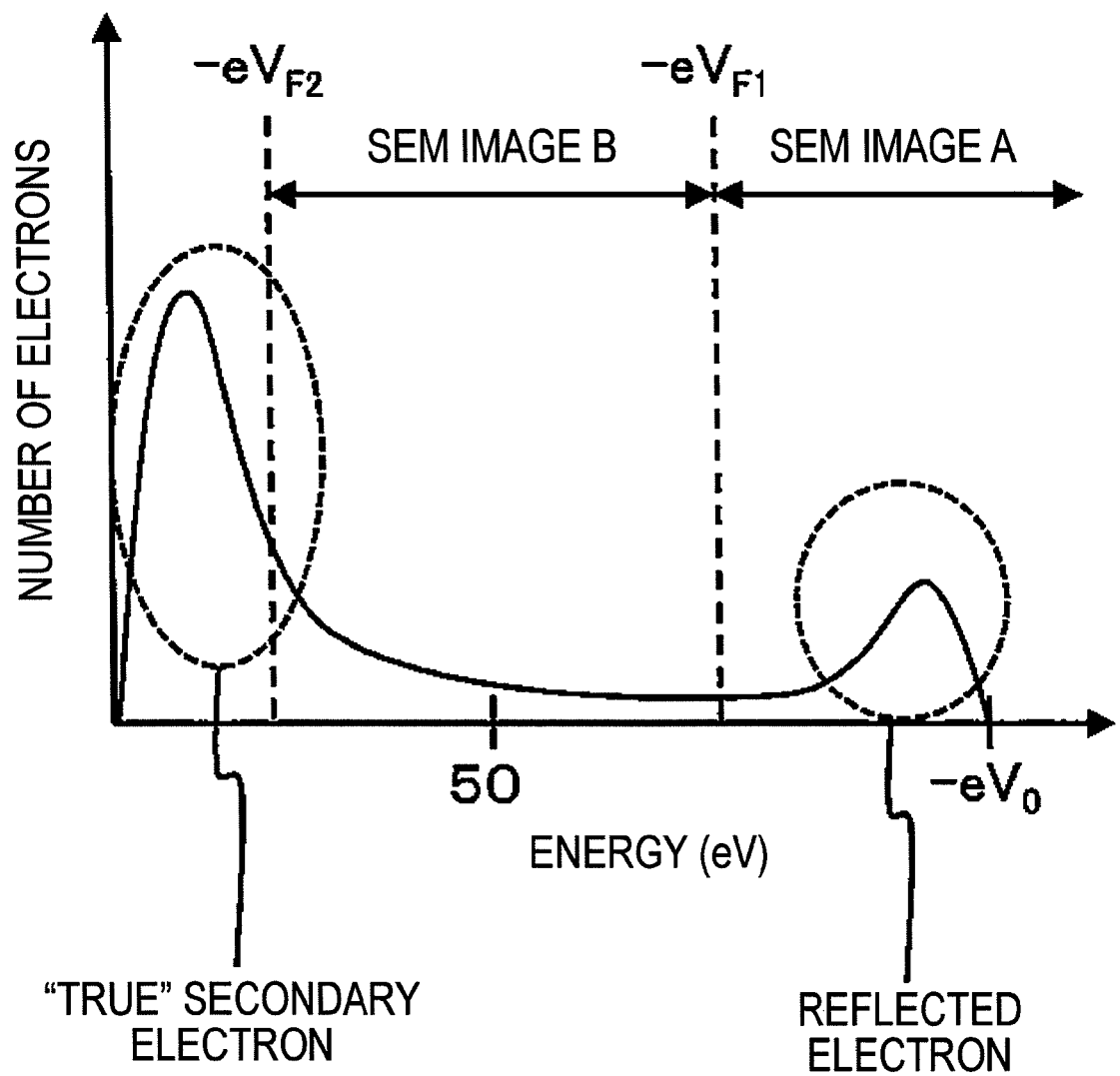
FIG. 13 is a graph for describing energy distribution of secondary electron and energy regions of the SEM images A and B.

FIG. 13 illustrates energy distribution of the secondary electrons, and energy ranges of SEM images A and B. Here, a value of $V_{F2}$ can be input to a second threshold input unit 2001 on a GUI 1901, similarly to $V_{F1}$. To be specific, $V_{F2}$ is set to the following voltage using the value $E_2$ input to the second threshold input unit 2001 and $V_R$.

[Mathematical Formula 11]

$$V_{F2} = V_R - E_2 \qquad (11)$$

Note that $E_2$ can be set only within a range in which $V_{F2}$ satisfies the formula (10). Which secondary electrons of which energy region an SEM image selected by the set $E_1$ and $E_2$, and an SEM image selection button 1905 is formed is displayed in the slanted line portions in a detection energy range display unit 1906.

When an internal structure of a sample is visualized, a technique of performing the bandpath detection of the reflected electrons among the secondary electrons is effective.

A reason thereof is described with reference to FIG. 13. Among the reflected electrons, ones having energy close to $-eV_0$ are not scattered within the sample so much, and thus have information of a surface of the sample. Reflection electrons that have lost larger energy than $-eV_0$ are scattered inside the sample many times and are emitted outside the sample, and thus have information of the inside of the sample. Therefore, by setting $V_{F1}$ and $V_{F2}$ such that the SEM image B is configured from only the reflected electrons that have lost the energy, an SEM image of an inside of a sample can be obtained.

Third Embodiment

Figure 14:
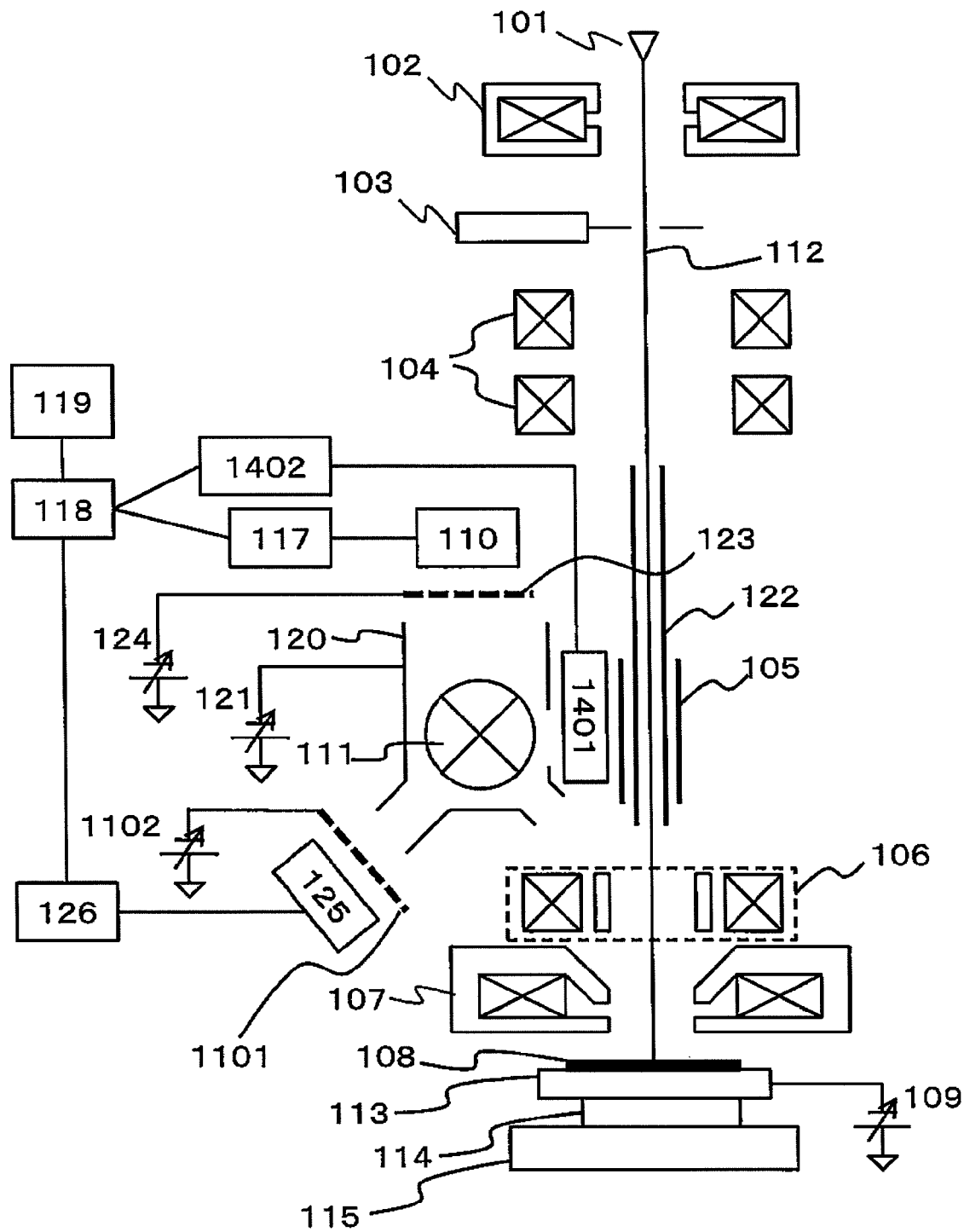
FIG. 14 is a schematic overall configuration diagram of a scanning electron microscope (SEM) according to a third embodiment.

FIG. 14 illustrates a configuration of a third embodiment. In the present embodiment, a detector C1401 and an image processor C1402 are added to the configuration of the second embodiment. Note that, in the present embodiment, a secondary electron decelerating electrode 120 has an opening in a direction of the detector C1401.

In the present embodiment, as the detector C1601, the Everhart-Thornley detector is used, similarly to the detectors A110 and B125. However, the effects of the present embodiment can be obtained even if other electron beam detectors are used for the detector C1601, such as a semiconductor detector or a micro channel plate.

The method of forming an SEM image in the detector C1601 is similar to the cases of the detectors A110 and B125. That is, the primary electron 112 is deflected by the deflector 104 so that the primary electron 112 scans the sample 108, and a signal detected in the detector C1401 is sent to the image processor C1402. In the image processor C1402, an SEM image is formed as a map of detection signals in synchronization with scanning signals. Hereinafter, the SEM image formed in the image processor C1402 is an SEM image C. The SEM image C is stored in the image memory unit 118, and the user can confirm the image in the image display unit 119 at any time.

Figure 15:
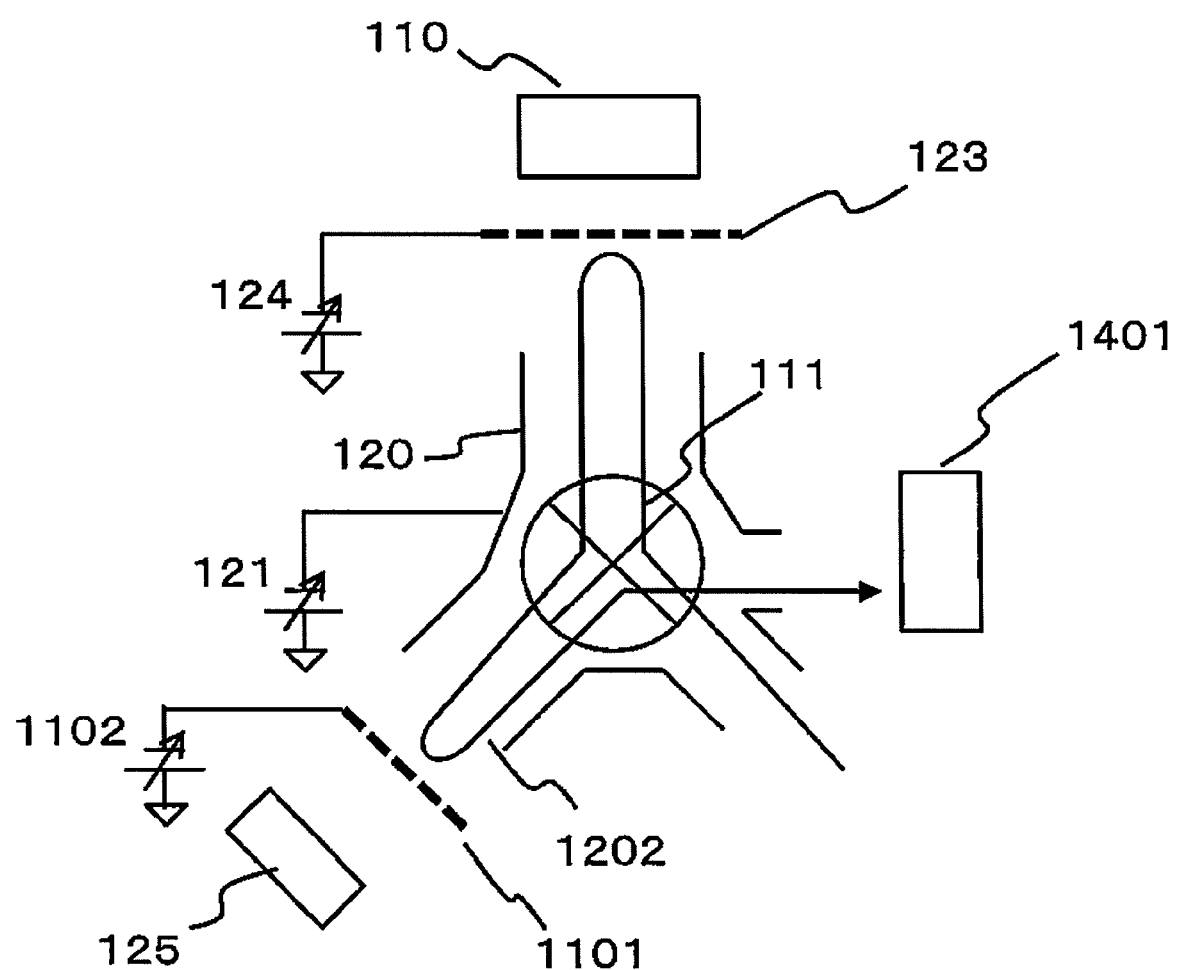
FIG. 15 is a diagram for describing loci of secondary electron reflected at energy filters A and B.

When a voltage is applied to the energy filter A123 and the energy filter B1101 under a condition that satisfies the formula (10), the secondary electron D1202 incident on the secondary electron decelerating electrode 120 is bounced back at the energy filter A123 and the energy filter B1101, and draws a locus illustrated in FIG. 15.

Figure 16:
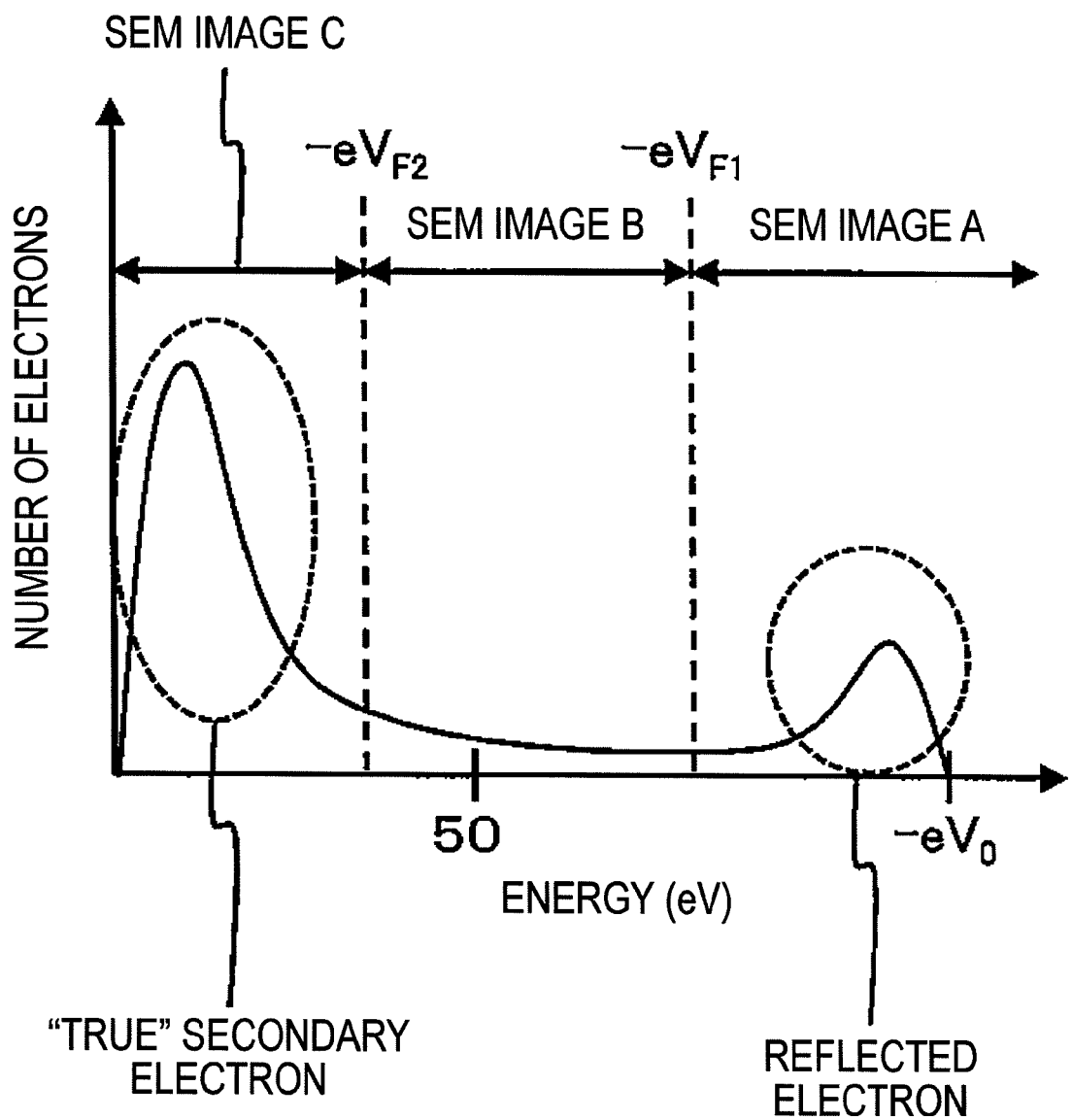
FIG. 16 is a graph for describing energy distribution of secondary electrons and energy regions of the SEM images A, B, and C.
Figure 20:
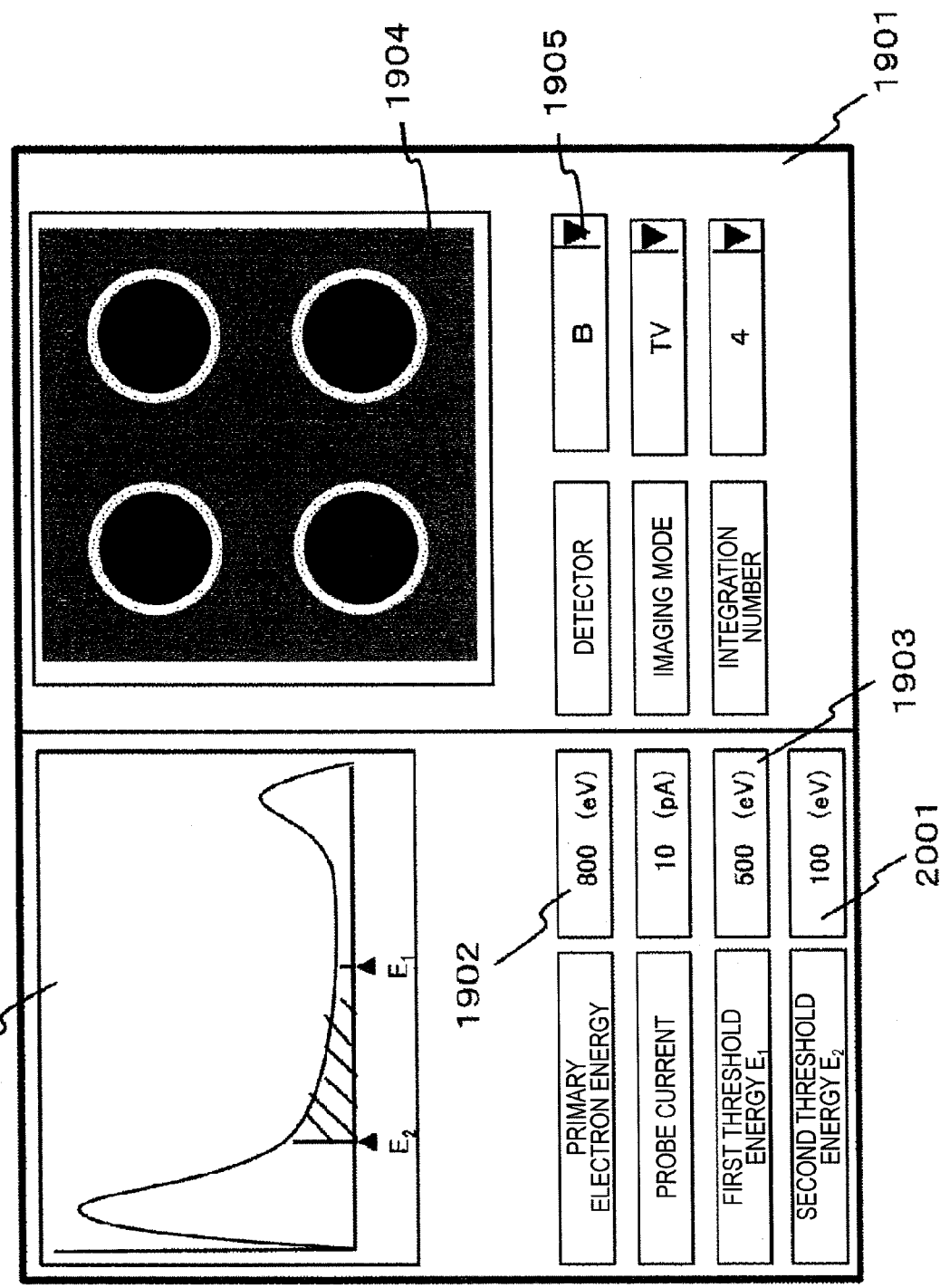
FIG. 20 is a diagram for describing a GUI screen for setting a voltage to the energy filters A and B.

The present embodiment has a configuration that the secondary electron D1202 bounced back at the energy filter B1101 is deflected in the magnetic generator 111, and is then detected in the detector C1401. In this case, the SEM image C is formed by the secondary electron D1202 having the $-eV_{F2}$ or less energy, and when combined with the SEM images A and B, SEM images of three types of energy bands can be concurrently obtained (FIG. 16). Note that $V_{F1}$ and $V_{F2}$ can be set by the GUI 1901 illustrated in FIG. 20, similarly to the second embodiment.

In the present embodiment, the user can measure the dimension of the pattern of the sample 108 from the SEM images A, B, and C.

Embodiments have been described. The described values are mere examples, and the invention is not limited to these examples. Further, the effects of the present invention can be obtained even if the directions of the electric field and the magnetic field in the ExB deflector 106, and the magnetic field of the magnetic generator ill are changed.

What is claimed is:

1. A charged particle beam device comprising:
    a charged particle source configured to generate a charged particle beam;
    a first deflector configured to deflect the charged particle beam from the charged particle source;
    a condenser lens configured to condense the charged particle beam;
    a stage configured to hold a sample to be irradiated with the charged particle beam;
    a power source unit configured to apply a retarding voltage that decelerates the charged particle beam to the sample or the stage;
    a second deflector configured to deflect secondary electrons from the sample outside an optical axis of the charged particle beam;
    a first grid configured to allow an electron to pass through or reflect the electron according to an energy of the electron;
    a first detector configured to detect a secondary electron that has passed through the first grid;
    a second detector configured to detect a secondary electron that has been reflected at the first grid;
    a magnetic generator configured to deflect the secondary electron that has passed through the first grid and the secondary electron that has been reflected at the first grid; and
    a decelerating electrode that decelerates the secondary electrons, the decelerating electrode being positioned in a path between the second deflector and the first detector and configured from a conductor to have openings for allowing the secondary electrons to pass through three places.

2. The charged particle beam device according to claim 1, comprising a control unit that controls a voltage to be applied to the decelerating electrode according to the retarding voltage.

3. The charged particle beam device according to claim 1, comprising:
    a second grid that allows an electron to pass through or reflects the electron according to energy of the electron, wherein
    the second grid is provided in a path between the magnetic generator and the second detector.

4. The charged particle beam device according to claim 3, further comprising a third detector that detects the secondary electron that has been reflected at the second grid.

5. The charged particle beam device according to claim 3, wherein the magnitude of an electric field formed in the second grid is smaller than the magnitude of an electric field formed in the first grid.

6. The charged particle beam device according to claim 1, wherein a magnetic shield is included between an optical axis of the charged particle beam and the magnetic generator.

7. The charged particle beam device according to claim 1, wherein an electric field shield of a ground conductor is included between an optical axis of the charged particle beam and the magnetic generator.

8. A length measuring method using the charged particle beam device according to claim 1, the method comprising:
    forming a first image by a signal obtained in the first detector;
    forming a second image by a signal obtained in the second detector; and
    measuring a dimension of a pattern of the sample from each of the first image and the second image, wherein
    measuring points of the dimension of the sample are different in the first image and the second image.

9. A length measuring method using the charged particle beam device according to claim 4, the method comprising:
    forming a first image by a signal obtained in the first detector;
    forming a second image by a signal obtained in the second detector;
    forming a third image by a signal obtained in the third detector; and
    measuring a dimension of a pattern of the sample from each of the first image, the second image, and the third image, wherein measuring points of the dimension of the sample are different from each other in the first image, the second image, and the third image.

* * * * *